(12) United States Patent
Chen et al.

(10) Patent No.: US 11,206,048 B2
(45) Date of Patent: Dec. 21, 2021

(54) POLAR ENCODING AND DECODING METHOD, SENDING DEVICE, AND RECEIVING DEVICE

(71) Applicant: HUAWEI TECHNOLOGIES CO., LTD., Guangdong (CN)

(72) Inventors: Ying Chen, Hangzhou (CN); Gongzheng Zhang, Hangzhou (CN); Yunfei Qiao, Hangzhou (CN); Rong Li, Hangzhou (CN); Huazi Zhang, Hangzhou (CN); Hejia Luo, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 55 days.

(21) Appl. No.: 16/855,495

(22) Filed: Apr. 22, 2020

(65) Prior Publication Data

US 2020/0321984 A1 Oct. 8, 2020

Related U.S. Application Data

(63) Continuation of application No. 16/549,735, filed on Aug. 23, 2019, now Pat. No. 10,673,466, which is a (Continued)

(30) Foreign Application Priority Data

Apr. 1, 2017 (CN) .......................... 201710214465.0

(51) Int. Cl.
*H03M 13/00* (2006.01)
*H03M 13/39* (2006.01)
*H03M 13/13* (2006.01)

(52) U.S. Cl.
CPC ....... *H03M 13/3944* (2013.01); *H03M 13/13* (2013.01)

(58) Field of Classification Search
CPC .. H03M 13/13; H03M 13/3944; H03M 13/09; H03M 13/2906; H03M 13/616;
(Continued)

(56) References Cited

U.S. PATENT DOCUMENTS

| 6,105,158 A * | 8/2000 | Chen ..................... H03M 13/09 |
| | | 714/755 |
| 6,507,927 B1 * | 1/2003 | Kalliojarvi ........ H03M 13/4138 |
| | | 714/795 |

(Continued)

FOREIGN PATENT DOCUMENTS

| CN | 103825669 A | 5/2014 |
| CN | 105743621 A | 7/2016 |

(Continued)

OTHER PUBLICATIONS

Extended European Search Report issued in European Application No. 18774189.7 dated Mar. 2, 2020, 10 pages.
(Continued)

*Primary Examiner* — Esaw T Abraham
(74) *Attorney, Agent, or Firm* — Fish & Richardson P.C.

(57) ABSTRACT

This application provides a polar encoding and decoding method, a sending device, and a receiving device, to help overcome disadvantages in transmission of medium and small packets, a code rate, reliability, and complexity in the prior art. The method includes: pre-storing, by a computing device, at least one mother code sequence, wherein each mother code sequence comprises at least one subsequence and at least one subset, the at least one subsequence and the at least one subset each comprises one or more sequence numbers corresponding to one or more polarized channels, and wherein the one or more sequence numbers in each subsequence are arranged in an ascending order according to reliability of the corresponding one or more polarized channels; determining, by the computing device, a set of infor-
(Continued)

mation bit sequence numbers from the at least one mother code sequence based on a code length of a target polar code; and performing, by the computing device, polar encoding on information bits based on the set of information bit sequence numbers.

15 Claims, 3 Drawing Sheets

Related U.S. Application Data continuation of application No. PCT/CN2018/081189, filed on Mar. 29, 2018.

(58) Field of Classification Search
CPC .. H03M 13/635; H03M 13/00; H03M 13/134; H03M 13/1174; H04L 1/0057
See application file for complete search history.

(56) References Cited

U.S. PATENT DOCUMENTS

| | | | | |
|---|---|---|---|---|
| 8,831,067 | B2* | 9/2014 | Chen | H04L 1/0028 375/141 |
| 9,742,440 | B2* | 8/2017 | El-Khamy | H03M 13/6368 |
| 10,439,759 | B2* | 10/2019 | Chen | H04L 1/0057 |
| 10,440,606 | B2* | 10/2019 | Zhang | H04W 28/04 |
| 10,567,994 | B2* | 2/2020 | Zhang | H04L 1/0068 |
| 10,924,210 | B2* | 2/2021 | Chen | H03M 13/635 |
| 2004/0186809 | A1* | 9/2004 | Schlesinger | G06F 21/604 705/50 |
| 2008/0301536 | A1* | 12/2008 | Shin | H04L 1/0071 714/786 |
| 2015/0194987 | A1* | 7/2015 | Li | H03M 13/13 714/752 |
| 2015/0222295 | A1 | 8/2015 | Li et al. | |
| 2016/0013887 | A1 | 1/2016 | Shen et al. | |
| 2016/0218743 | A1 | 7/2016 | Li et al. | |
| 2017/0047947 | A1 | 2/2017 | Hong et al. | |

FOREIGN PATENT DOCUMENTS

| | | |
|---|---|---|
| KR | 20160086945 A | 7/2016 |
| KR | 20160130471 A | 11/2016 |
| WO | 2014154162 A1 | 10/2014 |

OTHER PUBLICATIONS

Huawei et al.,"Polar codes—encoding and decoding," 3GPP TSG RAN WG1 Meeting #xx, Nanjing, China. R1-164039, May 23-27, 2016, 7 pages.

MediaTek Inc et al.,"Examination of NR Coding Candidates for Low-Rate Applications." 3GPP TSG RAN WGI Meeting #86, R1-167871;Gothenburg, Sweden, Aug. 22-26, 2016, 15 pages.

Mondelli et al., "Construction of polar codes with sublinear complexity," retrieved from the Internet: URL <https://arxiv.org/pdf/1612.05295v3.pdf>, Jan. 31, 2017, 9 pages.

Office Action issued in Chinese Application No. 201811271216.6 dated Jun. 19, 2019, 5 pages.

PCT International Search Report and Written Opinion in International Application No. PCT/CN2018/081,189, dated Jun. 22, 2018, 17 pages (With English Translation).

Huawei, HiSilicon, "Theoretical analysis of the sequence generation," 3GPP TSG RAN WG1 Meeting #88bis, R1-1705084, Spokane, USA, Apr. 3-7, 2017, 8 pages.

Office Action issued in Japanese Application No. 2019-551274 dated Dec. 21, 2020, 9 pages (with English translation).

Samsung, "Design of a Nested Sequence for Polar Codes," 3GPP TSG RAN WG1 #88bis, R1-1705425, Spokane, WA, Apr. 3-7, 2017, 8 pages.

Office Action issued in Korean Application No. 2019-7026286 dated Nov. 27, 2020, 5 pages (with English translation).

* cited by examiner

POLAR ENCODING AND DECODING METHOD, SENDING DEVICE, AND RECEIVING DEVICE

CROSS-REFERENCE TO RELATED APPLICATIONS

This application is a continuation of U.S. patent application Ser. No. 16/549,735, filed on Aug. 23, 2019, (now U.S. Pat. No. 10,673,466, issued Jun. 2, 2020), which is a continuation of International Patent Application No. PCT/CN2018/081189, filed on Mar. 29, 2018, which claims priority to Chinese Patent Application No. 201710214465.0, filed on Apr. 1, 2017. All of the afore-mentioned patent applications are hereby incorporated by reference in their entireties.

TECHNICAL FIELD

This application relates to the polar code field, and more specifically, to a polar encoding and decoding method, a sending device, and a receiving device.

BACKGROUND

As a most fundamental radio access technology, channel encoding plays a crucial role in ensuring reliable data transmission. In an existing wireless communications system, channel encoding is usually performed by using a turbo code, a low-density parity-check (Low-Density Parity-Check, LDPC) code, or a polar code. The turbo code cannot support information transmission at an excessively low or high code rate. For transmission of medium and small packets, due to encoding and decoding characteristics of the turbo code and the LDPC code, it is difficult to achieve desired performance of the turbo code and the LDPC code in a case of a limited code length. In terms of implementation, the turbo code and the LDPC code in an encoding and decoding implementation process have relatively high computing complexity. The polar code has been theoretically proved to achieve a Shannon capacity and has relatively low encoding and decoding complexity, and therefore is widely applied.

The polar code is a linear block code. A generator matrix of a polar code is $F_N$, and an encoding process of a polar code is $x_1^N = u_1^N \cdot F_N$. $u_1^N = (u_1, u_2, u_3, \ldots u_N)$ is a binary row vector with a length of N, where $N=2^n$, and n is a positive integer. In an encoding process of the polar code, some bits in $u_1^N$ are used to carry information, and are referred to as information bits. A set of indexes of the information bits is denoted as A. The other bits in $u_1^N$ are set to fixed values that are pre-agreed on by a receive end and a transmit end, and are referred to as fixed bits. The encoding process of the polar code mainly depends on a process of selecting the set A, and the set A decides performance of polar encoding and decoding. Most existing polar encoding solutions use an online computing or offline storage manner to determine a sequence number set of information bits. Because the online computing manner considers no parameter of an actual channel, a decoding failure is easily caused by different computing precision between transmit and receive ends, and a latency and complexity of online computing are relatively high. In the offline storage manner, to support various combinations of code lengths and code rates, transmit and receive ends need to store a large quantity of mother code sequences, resulting in huge storage overheads and lack of flexibility.

With rapid evolution of wireless communications systems, a future communications system (for example, 5G) exhibits some new characteristics. For example, three most typical communication scenarios include: enhanced mobile broadband (eMBB), massive machine type communications (mMTC), and ultra-reliable and low latency communications (URLLC). These communication scenarios impose higher requirements on data transmission in aspects such as reliability, complexity, flexibility, and a latency. In addition, an important characteristic that distinguishes eMBB and mMTC from an existing Long Term Evolution (LTE) technology lies in transmission of medium and small packets, and therefore channel encoding is required to better support communication of such code lengths.

Therefore, to meet higher requirements of the future wireless communications system on data transmission in aspects such as a code rate, reliability, a latency, flexibility, and complexity, a new encoding and decoding technology is urgently needed, to overcome disadvantages of a channel encoding technology in the prior art in these aspects.

SUMMARY

This application provides a polar encoding and decoding method, to help overcome disadvantages of a channel encoding technology in the prior art in aspects such as a code rate, reliability, a latency, flexibility, and complexity.

According to a first aspect, this application provides a polar encoding method, where the method includes: prestoring, by a sending device, at least one mother code sequence, where each mother code sequence includes at least one subsequence and at least one subset, an element in each subsequence or subset is a sequence number of a polarized channel, each subsequence or subset includes at least one sequence number, and relative locations of sequence numbers in each subsequence are arranged in order of reliability of polarized channels; determining, by the sending device, an information bit sequence number set from the at least one mother code sequence based on a code length of a target polar code; and performing, by the sending device, polar encoding on information bits based on the information bit sequence number set.

In a possible implementation, relative locations of the at least one subsequence and the at least one subset are arranged in order of reliability of polarized channels, and when reliability of a first subsequence in the at least one subsequence is higher than reliability of an adjacent first subset, reliability of a polarized channel corresponding to any sequence number in the first subsequence is higher than reliability of a polarized channel corresponding to any sequence number in the first subset; or when reliability of a first subset in the at least one subset is higher than reliability of an adjacent second subset, reliability of a polarized channel corresponding to any sequence number in the first subset is higher than reliability of a polarized channel corresponding to any sequence number in the second subset; or when reliability of a first subset in the at least one subset is higher than reliability of a first subsequence in the at least one subsequence, reliability of a polarized channel corresponding to any sequence number in the first subset is higher than reliability of a polarized channel corresponding to any sequence number in the first subsequence.

In a possible implementation, the determining, by the sending device, an information bit sequence number set from the at least one mother code sequence based on a code length of a target polar code includes: determining, by the sending device, the information bit sequence number set from the at least one mother code sequence based on a quantity K of information bits in the target polar code or a quantity F of fixed bits in the target polar code.

In a possible implementation, the determining, by the sending device, the information bit sequence number set from the at least one mother code sequence based on a quantity K of information bits in the target polar code includes: selecting, by the sending device based on the quantity K of the information bits, non-punctured sequence numbers less than or equal to N from a maximum mother code sequence in the at least one mother code sequence in descending order of reliability as a mother code sequence of the target polar code; and determining, by the sending device, the information bit sequence number set based on the mother code sequence of the target polar code, where N is a mother code length of the target polar code.

In a possible implementation, the selecting, by the sending device, the information bit sequence number set from the maximum mother code sequence based on the quantity K of the information bits in the target polar code includes:

sequentially selecting, by the sending device in descending order of reliability, K non-punctured sequence numbers less than or equal to N from the maximum mother code sequence as the information bit sequence number set, where N is the mother code length of the target polar code.

In this implementation, the quantity K of the information bits is a quantity of non-fixed bits. When there is a check bit, K in this specification also includes the check bit.

In a possible implementation, the determining, by the sending device, the information bit sequence number set from the at least one mother code sequence based on a quantity K of information bits in the target polar code includes: when $K=M_1$, selecting, by the sending device in descending order of reliability, the first $M_1$ non-punctured sequence numbers from the mother code sequence of the target polar code as the information bit sequence number set, where $M_1$ is a quantity of sequence numbers in the first at least one subsequence or subset in the mother code sequence of the target polar code in descending order of reliability, $M_1 \geq 1$, and $M_1$ is an integer.

In a possible implementation, the determining, by the sending device, the information bit sequence number set from the at least one mother code sequence based on a quantity K of information bits in the target polar code includes: when $M_1<K \leq M_2$, selecting, by the sending device in descending order of reliability, the first $M_1$ non-punctured sequence numbers from the mother code sequence of the target polar code as a first sequence number set, where $M_1$ is a quantity of sequence numbers in the first at least one subsequence or subset in the mother code sequence of the target polar code in descending order of reliability, $M_2>M_1$, and $M_1$ and $M_2$ are positive integers; selecting, by the sending device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set; and determining sequence numbers in the first sequence number set and the second sequence number set as the information bit sequence number set.

In a possible implementation, a third subset is adjacent to the subsequence or the subset in which the $M_1$ non-punctured sequence numbers are located, and the selecting, by the sending device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes: selecting, by the sending device in descending order of reliability in an online computing or table reading manner, $(K-M_1)$ sequence numbers from non-punctured sequence numbers in the third subset as the second sequence number set.

In a possible implementation, a second subsequence is adjacent to the subsequence or the subset in which the $M_1$ non-punctured sequence numbers are located, and the selecting, by the sending device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes: selecting, by the sending device in descending order of reliability, $(K-M_1)$ sequence numbers from non-punctured sequence numbers in the second subsequence as the second sequence number set.

In a possible implementation, the sending device further prestores a first sorting table, and the first sorting table records reliability sorting of the non-punctured sequence numbers in the third subset, and the selecting, by the sending device in descending order of reliability in a table reading manner, $(K-M_1)$ sequence numbers from non-punctured sequence numbers in the third subset as the second sequence number set includes: selecting, by the sending device in descending order of reliability, $(K-M_1)$ non-punctured sequence numbers from the first sorting table as the second sequence number set.

In a possible implementation, the determining, by the sending device, the information bit sequence number set from the at least one mother code sequence based on a quantity F of fixed bits in the target polar code includes: selecting, by the sending device based on the quantity F of the fixed bits in ascending order of reliability, non-punctured sequence numbers less than or equal to N from a maximum mother code sequence in the at least one mother code sequence as a mother code sequence of the target polar code; and determining, by the sending device, a fixed bit sequence number set based on the mother code sequence of the target polar code, where N is a mother code length of the target polar code; and determining, by the sending device, a complement of the fixed bit sequence number set relative to a set including sequence numbers in the mother code sequence of the target polar code as the information bit sequence number set.

In a possible implementation, the determining, by the sending device, the information bit sequence number set from the at least one mother code sequence based on a quantity F of fixed bits in the target polar code includes: when $F=M_3$, selecting, by the sending device in ascending order of reliability, the first $M_3$ non-punctured sequence numbers from the mother code sequence of the target polar code as a fixed bit sequence number set, where $M_3$ is a quantity of sequence numbers in the first at least one subsequence or subset in the mother code sequence of the target polar code in ascending order of reliability, $M_3 \geq 1$, and $M_3$ is an integer; and determining, by the sending device, a complement of the fixed bit sequence number set relative to a set including sequence numbers in the mother code sequence of the target polar code as the information bit sequence number set.

In a possible implementation, the determining, by the sending device, the information bit sequence number set from the at least one mother code sequence based on a quantity F of fixed bits in the target polar code includes: when $M_3<F \leq M_4$, selecting, by the sending device in ascending order of reliability, the first $M_3$ non-punctured sequence numbers from the mother code sequence of the target polar code as a third sequence number set, where $M_3$ is a quantity of sequence numbers in the first at least one subsequence or subset in the mother code sequence of the target polar code in ascending order of reliability, $M_4 > M_3$ and $M_3$ and $M_4$ are positive integers; selecting, by the sending device in ascending order of reliability from a subsequence or a subset adjacent to a subsequence or a subset in which the $M_3$ non-punctured sequence numbers are located, $(F−M_3)$ sequence numbers as a fourth sequence number set; determining, by the sending device, sequence numbers in the third sequence number set and the fourth sequence number set as a fixed bit sequence number set; and determining, by the sending device, a complement of the fixed bit sequence number set relative to a set including sequence numbers in the mother code sequence of the target polar code as the information bit sequence number set.

In a possible implementation, a fourth subset is adjacent to the subsequence or the subset in which the $M_3$ non-punctured sequence numbers are located, and the selecting, by the sending device in ascending order of reliability from a subsequence or a subset adjacent to a subsequence or a subset in which the $M_3$ non-punctured sequence numbers are located, $(F−M_3)$ sequence numbers as a fourth sequence number set includes: selecting, by the sending device in ascending order of reliability in an online computing or table reading manner, $(F−M_3)$ sequence numbers from non-punctured sequence numbers in the fourth subset as the fourth sequence number set.

In a possible implementation, the sending device further prestores a second sorting table, and the second sorting table records reliability sorting of the non-punctured sequence numbers in the fourth subset, and the selecting, by the sending device in ascending order of reliability in a table reading manner, $(F−M_3)$ sequence numbers from non-punctured sequence numbers in the fourth subset as the fourth sequence number set includes: selecting, by the sending device in descending order of reliability, $(F−M_3)$ non-punctured sequence numbers from the second sorting table as the fourth sequence number set.

According to a second aspect, this application provides a polar decoding method, where the method includes: prestoring, by a receiving device, at least one mother code sequence, where each mother code sequence includes at least one subsequence and at least one subset, an element in each subsequence or subset is a sequence number of a polarized channel, each subsequence or subset includes at least one sequence number, and relative locations of sequence numbers in each subsequence are arranged in order of reliability of polarized channels; obtaining, by the receiving device, a to-be-decoded sequence; and decoding, by the receiving device, the to-be-decoded sequence based on a code length of a target polar code and the at least one mother code sequence.

In a possible implementation, relative locations of the at least one subsequence and the at least one subset are arranged in order of reliability of polarized channels, and when reliability of a first subsequence in the at least one subsequence is higher than reliability of an adjacent first subset, reliability of a polarized channel corresponding to any sequence number in the first subsequence is higher than reliability of a polarized channel corresponding to any sequence number in the first subset; or when reliability of a first subset in the at least one subset is higher than reliability of an adjacent second subset, reliability of a polarized channel corresponding to any sequence number in the first subset is higher than reliability of a polarized channel corresponding to any sequence number in the second subset; or when reliability of a first subset in the at least one subset is higher than reliability of a first subsequence in the at least one subsequence, reliability of a polarized channel corresponding to any sequence number in the first subset is higher than reliability of a polarized channel corresponding to any sequence number in the first subsequence.

In a possible implementation, the decoding, by the receiving device, the to-be-decoded sequence based on a code length of a target polar code and the at least one mother code sequence includes: determining, by the receiving device, an information bit sequence number set based on the at least one mother code sequence and a quantity K of information bits in the target polar code or a quantity F of fixed bits in the target polar code; and decoding, by the receiving device, the to-be-decoded sequence based on the information bit sequence number set.

In a possible implementation, the determining, by the receiving device, an information bit sequence number set based on the at least one mother code sequence and a quantity K of information bits in the target polar code includes: selecting, by the receiving device based on the quantity K of the information bits, non-punctured sequence numbers less than or equal to N from a maximum mother code sequence in the at least one mother code sequence in descending order of reliability as a mother code sequence of the target polar code; determining, by the receiving device, the information bit sequence number set based on the mother code sequence of the target polar code; and decoding, by the receiving device, the to-be-decoded sequence based on the information bit sequence number set, where N is a mother code length of the target polar code.

In a possible implementation, the selecting, by the receiving device, a fixed bit sequence number set from the maximum mother code sequence based on the quantity F of the fixed bits in the target polar code includes:

sequentially selecting, by the sending device in ascending order of reliability, F non-punctured sequence numbers less than or equal to N from the maximum mother code sequence as the fixed bit sequence number set, where N is the mother code length of the target polar code.

In a possible implementation, the determining, by the receiving device, the information bit sequence number set based on the mother code sequence of the target polar code includes: when $K=M_1$, selecting, by the receiving device in descending order of reliability, the first non-punctured sequence numbers from the mother code sequence of the target polar code as the information bit sequence number set, where $M_1$ is a quantity of sequence numbers in the first at least one subsequence or subset in the mother code sequence of the target polar code in descending order of reliability. $M_1 \geq 1$, and $M_1$ is an integer.

In a possible implementation, the determining, by the receiving device, the information bit sequence number set based on the mother code sequence of the target polar code includes: when $M_1 < K \leq M_2$, selecting, by the receiving device in descending order of reliability, the first $M_1$ non-punctured sequence numbers from the mother code sequence of the target polar code as a first sequence number set, where $M_1$ is a quantity of sequence numbers in the first at least one subsequence or subset in the mother code sequence of the target polar code in descending order of reliability, $M_2 > M_1$, and $M_1$ and $M_2$ are positive integers; selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set; and determining, by the receiving device, sequence numbers in the first sequence number set and the second sequence number set as the information bit sequence number set.

In a possible implementation, a third subset is adjacent to the subsequence or the subset in which the $M_1$ non-punctured sequence numbers are located, and the selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes: selecting, by the receiving device in descending order of reliability in an online computing or table reading manner, $(K-M_1)$ sequence numbers from non-punctured sequence numbers in the third subset as the second sequence number set; and determining, by the receiving device, the first sequence number set and the second sequence number set as the information bit sequence number set.

In a possible implementation, a second subsequence is adjacent to the subsequence or the subset in which the $M_1$ non-punctured sequence numbers are located, and the selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes: selecting, by the receiving device in descending order of reliability, $(K-M_1)$ sequence numbers from non-punctured sequence numbers in the second subsequence as the second sequence number set.

In a possible implementation, the receiving device further prestores a first sorting table, and the first sorting table records reliability sorting of the non-punctured sequence numbers in the third subset, and the selecting, by the receiving device in descending order of reliability in an online computing or table reading manner, $(K-M_1)$ sequence numbers from non-punctured sequence numbers in the third subset as the second sequence number set includes: selecting, by the receiving device in descending order of reliability, $(K-M_1)$ non-punctured sequence numbers from the first sorting table as the second sequence number set.

In a possible implementation, the decoding, by the receiving device, the to-be-decoded sequence based on the at least one mother code sequence and the quantity F of the fixed bits in the target polar code includes: selecting, by the receiving device based on the quantity F of the fixed bits in ascending order of reliability, non-punctured sequence numbers less than or equal to N from a maximum mother code sequence in the at least one mother code sequence as a mother code sequence of the target polar code; determining, by the receiving device, a fixed bit sequence number set based on the mother code sequence of the target polar code, where N is a mother code length of the target polar code; and determining, by the receiving device, a complement of the fixed bit sequence number set relative to a set including sequence numbers in the mother code sequence of the target polar code as the information bit sequence number set.

In a possible implementation, the determining, by the receiving device, the information bit sequence number set from the at least one mother code sequence based on a quantity F of fixed bits in the target polar code includes: when $F=M_3$, selecting, by the receiving device in ascending order of reliability, the first $M_3$ non-punctured sequence numbers from the mother code sequence of the target polar code as a fixed bit sequence number set, where $M_3$ is a quantity of sequence numbers in the first at least one subsequence or subset in the mother code sequence of the target polar code in ascending order of reliability, $M_3 \geq 1$, and $M_3$ is an integer; and determining, by the receiving device, a complement of the fixed bit sequence number set relative to a set including sequence numbers in the mother code sequence of the target polar code as the information bit sequence number set.

In a possible implementation, the determining, by the receiving device, the information bit sequence number set from the at least one mother code sequence based on a quantity F of fixed bits in the target polar code includes: when $M_3 < F \leq M_4$, selecting, by the receiving device in ascending order of reliability, the first $M_3$ non-punctured sequence numbers from the mother code sequence of the target polar code as a third sequence number set, where $M_3$ is a quantity of sequence numbers in the first at least one subsequence or subset in the mother code sequence of the target polar code in ascending order of reliability, $M_4 > M_3$, and $M_3$ and $M_4$ are positive integers; selecting, by the receiving device in ascending order of reliability from a subsequence or a subset adjacent to a subsequence or a subset in which the $M_3$ non-punctured sequence numbers are located, $(F-M_3)$ sequence numbers as a fourth sequence number set; determining, by the receiving device, sequence numbers in the third sequence number set and the fourth sequence number set as a fixed bit sequence number set; and determining, by the receiving device, a complement of the fixed bit sequence number set relative to a set including sequence numbers in the mother code sequence of the target polar code as the information bit sequence number set.

In a possible implementation, a fourth subset is adjacent to the subsequence or the subset in which the $M_3$ non-punctured sequence numbers are located, and the selecting, by the receiving device in ascending order of reliability from a subsequence or a subset adjacent to a subsequence or a subset in which the $M_3$ non-punctured sequence numbers are located, $(F-M_3)$ sequence numbers as a fourth sequence number set includes: selecting, by the receiving device in ascending order of reliability in an online computing or table reading manner, $(F-M_3)$ sequence numbers from non-punctured sequence numbers in the fourth subset as the fourth sequence number set.

In a possible implementation, the receiving device further prestores a second sorting table, and the second sorting table records reliability sorting of the non-punctured sequence numbers in the fourth subset, and the selecting, by the receiving device in ascending order of reliability in a table reading manner, $(F-M_3)$ sequence numbers from non-punctured sequence numbers in the fourth subset as the fourth sequence number set includes: selecting, by the receiving device in descending order of reliability, $(F-M_3)$ non-punctured sequence numbers from the second sorting table as the fourth sequence number set.

According to a third aspect, this application provides a sending device, configured to perform the method according to any one of the first aspect or the possible implementations of the first aspect. Specifically, the sending device includes a unit configured to perform the method according to any one of the first aspect or the possible implementations of the first aspect.

According to a fourth aspect, this application provides a receiving device, configured to perform the method according to any one of the second aspect or the possible implementations of the second aspect. Specifically, the receiving device includes a unit configured to perform the method according to any one of the second aspect or the possible implementations of the second aspect.

According to a fifth aspect, this application provides a sending device. The sending device includes one or more processors, one or more memories, and one or more transceivers (each transceiver includes a transmitter and a receiver). The transmitter or the receiver is connected to one or more antennas, and sends or receives a signal by using the one or more antennas. The memory is configured to store a computer program instruction (or code). The processor is configured to execute the instruction stored in the memory, and when the instruction is executed, the processor performs the method according to any one of the first aspect or the possible implementations of the first aspect.

Optionally, the memory may be independent, or may be integrated with the processor. When the processor is implemented by using hardware, for example, may be a logical circuit or an integrated circuit, and connected to other hardware by using an interface, the memory may not be needed.

According to a sixth aspect, this application provides a receiving device. The receiving device includes one or more processors, one or more memories, and one or more transceivers (each transceiver includes a transmitter and a receiver). The transmitter or the receiver is connected to one or more antennas, and sends or receives a signal by using the one or more antennas. The memory is configured to store a computer program instruction code). The processor is configured to execute the instruction stored in the memory, and when the instruction is executed, the processor performs the method according to any one of the second aspect or the possible implementations of the second aspect.

Optionally, the memory may be independent, or may be integrated with the processor. When the processor is implemented by using hardware, for example, may be a logical circuit or an integrated circuit, and connected to other hardware by using an interface, the memory may not be needed.

According to a seventh aspect, this application provides a computer-readable storage medium. The computer-readable storage medium stores an instruction, and when the instruction runs on a computer, the computer performs the method according to any one of the first aspect or the possible implementations of the first aspect.

According to an eighth aspect, this application provides a computer-readable storage medium. The computer-readable storage medium stores an instruction, and when the instruction runs on a computer, the computer performs the method according to any one of the second aspect or the possible implementations of the second aspect.

In technical solutions provided in embodiments of this application, a mother code sequence of a polar code including a sequence and a set that are interleaved is provided, so that in a process of performing polar encoding and decoding by using a mother code sequence in such a form, a half-computing and half-storage manner may be used to select information bits (that is, determine an information bit sequence number set). Therefore, a polar code sequence is constructed more flexibly. In addition, disadvantages in aspects such as transmission of medium and small data packets, reliability, complexity, and a code rate in the prior art are overcome to some extent.

DESCRIPTION OF EMBODIMENTS

The following describes the technical solutions in this application with reference to the accompanying drawings.

First, a technology related to a polar code in this application is briefly described.

The polar code is a linear block code. A generator matrix of the polar code is $F_N$, and an encoding process of the polar code is $x_1^N = u_1^M \cdot F_N$. $u_1^N = (u_1, u_2, u_3, \ldots, u_N)$ is a binary row vector with a length of N, where $N=2^n$, and n is a positive integer. $F_N F_2^{\otimes (\log_2 N)}$, and $$F_2 = \begin{bmatrix} 1 & 0 \\ 1 & 1 \end{bmatrix}, F_2^{\otimes (\log_2 N)}$$

is defined as a Kronecker product of $\log_2 N$ matrices $F_2$. Addition and multiplication operations in the foregoing formulas are addition and multiplication operations in the binary Galois field.

In an encoding process of the polar code, some bits in $u_1^N$ are used to carry information, and are referred to as information bits. A set of indexes of the information bits is denoted as A. The other bits in $u_1^N$ are set to fixed values that are pre-agreed on by a receive end and a transmit end, and are referred to as fixed bits. A set of indexes of the fixed bits is represented by using a complement set $A^c$ of A. A polar code construction process mainly depends on a process of selecting the set A, and the set A decides performance of the polar code.

In view of higher requirements on data transmission that are imposed by several typical communication scenarios, for example, eMBB, mMTC, and URLLC, of a future communications system (for example, 5G) in aspects such as reliability, latency, encoding and decoding complexity, and flexibility, embodiments of this application provide a polar encoding and decoding method, to overcome disadvantages of a polar code in aspects such as a code rate, reliability, a latency, flexibility, and complexity in the prior art.

The following describes in detail the polar encoding and decoding method provided in the embodiments of this application.

Numbers "first", "second", and the like in the embodiments of this application are merely intended to distinguish between different objects, for example, to distinguish between different subsequences or subsets, and shall not limit the protection scope of the embodiments of this application.

Figure 1:
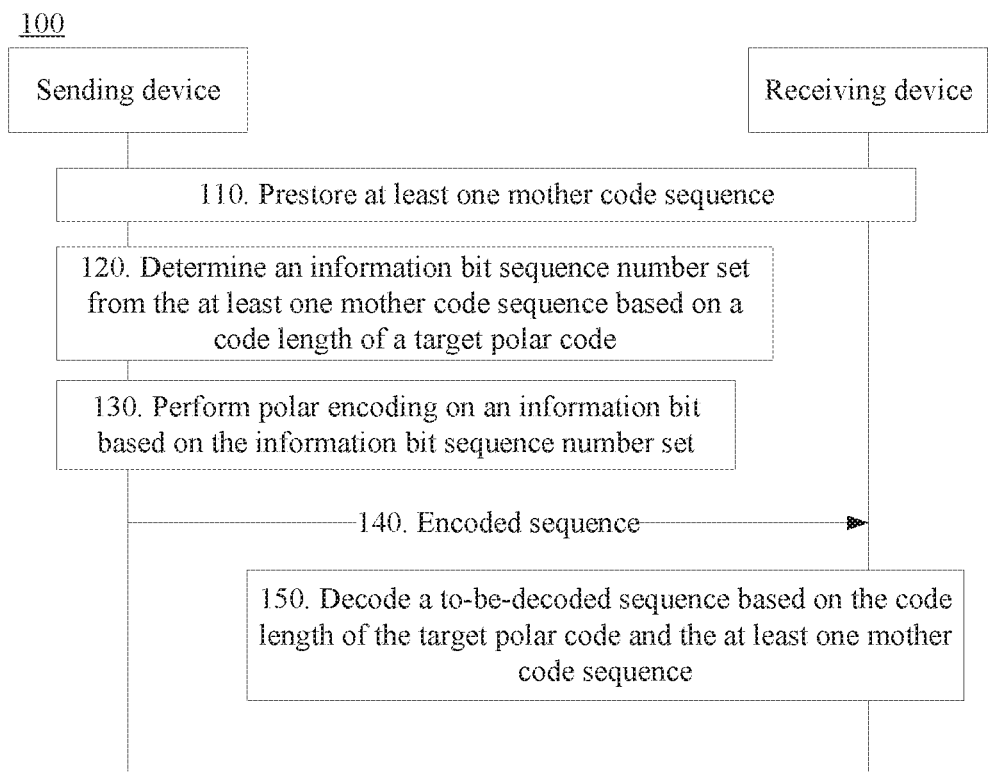
FIG. 1 is a schematic interaction diagram of a polar encoding and decoding method according to this application.

FIG. 1 is a schematic interaction diagram of a polar encoding and decoding method 100 according to this application. Referring to FIG. 1, the method 100 mainly includes steps 110 to 150.

110. A sending device and a receiving device prestore at least one mother code sequence.

Each mother code sequence includes at least one subsequence and at least one subset, an element in each subsequence or subset is a sequence number of a polarized channel, each subsequence or subset includes at least one sequence number, and relative locations of sequence numbers in each subsequence are arranged in order of reliability of polarized channels.

Reliability of a polarized channel may be calculated by using a method such as density evolution, Gaussian approximation, or linear fitting in the prior art. A specific calculation process may be the same as that in the prior art. For brevity, details are not described herein.

In addition, a parameter such as an error probability, a channel capacity, or a polarization weight may be selected as a parameter for measuring the reliability of the polarized channel, or another parameter that can be used to measure the polarized channel may be selected. This is not particularly limited in this embodiment of the present invention.

In this embodiment of this application, the mother code sequence stored in the sending device and the receiving device is an ordered sequence including a subsequence and a subset that are sorted in an interleaved manner. Any two adjacent parts in the mother code sequence may be a subsequence and a subsequence, or may be a subsequence and a subset, or may be a subset and a subset.

For ease of understanding, a mother code sequence with a code length of 32 is given herein as an example. For example, the mother code sequence is [0, 1, 2, 4, 8], {16, 3}, {5, 6, 9, 10}, {17, 12}, {18, 20, 7, 24, 11, 13}, {19, 14}, [21, 22, 25, 26], {28, 15}, [23, 27, 29, 30, 31].

In this mother code sequence, subsequences and subsets are arranged in an interleaved manner. A quantity of sequence numbers in each subsequence or subset may be any quantity (at least one).

For example, if sorting is performed in descending order of reliability of polarized channels, reliability of a polarized channel corresponding to a sequence number in a subsequence or a subset sorted near the front is higher than reliability of a polarized channel corresponding to a sequence number in a subsequence or a subset sorted near the rear.

For another example, if sorting is performed in ascending order of reliability of polarized channels, reliability of a polarized channel corresponding to a sequence number in a subsequence or a subset sorted near the front is lower than reliability of a polarized channel corresponding to a sequence number in a subsequence or a subset sorted near the rear.

It should be noted that, all sequence numbers included in a subsequence are sorted in order of reliability of polarized channels corresponding to the sequence numbers. In other words, the sequence numbers in the subsequence are ordered. As described above, if sequence numbers in the mother code sequence are sorted in descending order of reliability of polarized channels, sequence numbers in any subsequence in the mother code sequence are also sorted in descending order of reliability of polarized channels corresponding to the sequence numbers. Then reliability of a polarized channel corresponding to a sequence number near the front of the subsequence is higher than reliability of a polarized channel corresponding to a sequence number near the rear of the subsequence.

In this embodiment of this application, sequence numbers in a subset are not ordered. In other words, in a subset, the arrangement of sequence numbers are irrelevant to reliability of their corresponding polarized channels.

In addition, when reliability of a subsequence (denoted as a subsequence #A) is higher than reliability of another subsequence (denoted as a subsequence #B) in this embodiment of this application, reliability of a polarized channel corresponding to any sequence number in the subsequence #A is higher than reliability of a polarized channel corresponding to any sequence number in the subsequence #B. The same is true for magnitude comparison between reliability of a subsequence and reliability of a subset, or magnitude comparison between reliability of a subset and reliability of another subset.

Optionally, in an embodiment, relative locations of the at least one subsequence and the at least one subset are arranged in order of reliability of polarized channels, and when reliability of a first subsequence in the at least one subsequence is higher than reliability of an adjacent first subset, reliability of a polarized channel corresponding to any sequence number in the first subsequence is higher than reliability of a polarized channel corresponding to any sequence number in the first subset; or when reliability of a first subset in the at least one subset is higher than reliability of an adjacent second subset, reliability of a polarized channel corresponding to any sequence number in the first subset is higher than reliability of a polarized channel corresponding to any sequence number in the second subset; or when reliability of a first subset in the at least one subset is higher than reliability of a first subsequence in the at least one subsequence, reliability of a polarized channel corresponding to any sequence number in the first subset is higher than reliability of a polarized channel corresponding to any sequence number in the first subsequence.

Figure 2:
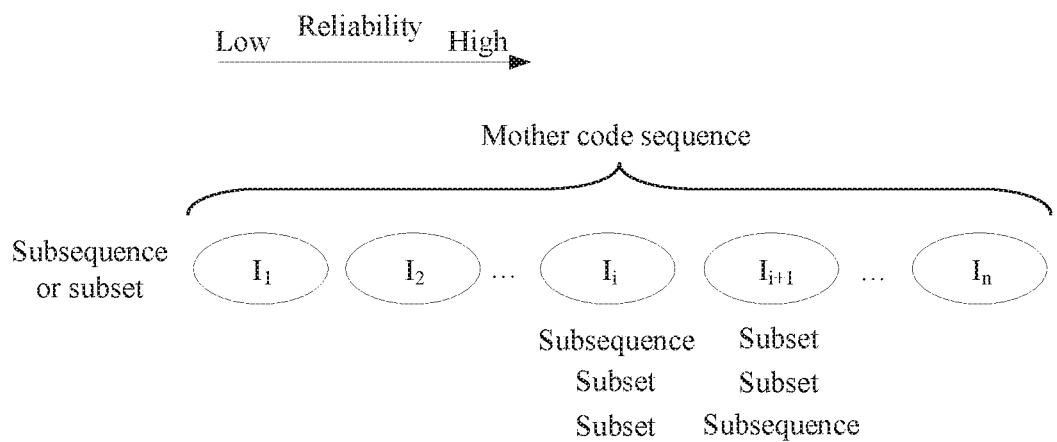
FIG. 2 is a schematic structural diagram of a mother code sequence according to this application.

FIG. 2 is a schematic structural diagram of a mother code sequence according to this application. Referring to FIG. 2, the mother code sequence is $(I_1, I_2, \ldots, I_i, I_{i+1}, \ldots, I_n)$, where I represents a subsequence or a subset. If sequence numbers in the mother code sequence are sorted in ascending order of reliability of polarized channels, and $j>i$, reliability of a polarized channel corresponding to any sequence number in $I_j$ is higher than reliability of a polarized channel corresponding to any sequence number in $I_i$.

Using any two adjacent subsequences or subsets (for example, $I_i$ and $I_{i+1}$ shown in FIG. 2) in the mother code sequence as an example, $I_i$ and $I_{i+1}$ include the following several possible cases, Case 1

$I_i$ is a subsequence, and $I_{i+1}$ is a subset.

In the case 1, $I_i$ is a subsequence, and relative locations of sequence numbers in $I_i$ are sorted in order of reliability. $I_{i+1}$ is a subset, and reliability of polarized channels corresponding to sequence numbers in $I_{i+1}$ is not distinguished in relative magnitude (or value). However, because the entire mother code sequence is sorted in ascending order of reliability, and $I_i$ is located before $I_{i+1}$, reliability of a polarized channel corresponding to any sequence number in $I_{i+1}$ is higher than reliability of a polarized channel corresponding to any sequence number in $I_i$.

Case 2

$I_i$ is a subset, and $I_{i+1}$ is a subset.

In the case 2, both $I_i$ and $I_{i+1}$ are subsets, and therefore reliability of polarized channels corresponding to sequence numbers in each of $I_i$ and $I_{i+1}$ is not distinguished in magnitude. However, because $I_i$ is located before $I_{i+1}$, reliability of a polarized channel corresponding to any sequence number in $I_i$ is lower than reliability corresponding to any sequence number in $I_{i+1}$.

Case 3

$I_i$ is a subset, and $I_{i+1}$ is a subsequence.

Similar to the case 2, $I_i$ herein is a subset, and reliability of polarized channels corresponding to sequence numbers in $I_{i+1}$ is not distinguished in magnitude. However, because $I_i$ is located before $I_{i+1}$, reliability of a polarized channel corresponding to any sequence number in $I_i$ is lower than that of a polarized channel whose reliability is the lowest in $I_{i+1}$.

In this embodiment of this application, a mother code sequence includes both at least one subsequence and at least one subset. A quantity of subsequences and a quantity of subsets are not limited, and they may be equal, or may be unequal. Moreover, each subsequence may include any quantity of (at least one) sequence numbers, and each subset may also include any quantity of (at least one) sequence numbers.

It should be noted that, in the mother code sequence provided in this embodiment of this application, sequence numbers in a subset may be sorted differently for polar codes with different lengths, different algorithms, or different parameters in a same algorithm. However, even if different algorithms are used or different parameters in a same algorithm are used, sorting of sequence numbers in a subsequence remains unchanged.

120. The sending device determines an information bit sequence number set from the at least one mother code sequence based on a code length of a target polar code.

It may be teamed from the foregoing description of the polar code that, the most main part of an encoding process of a polar code is about selection of information bit locations, that is, determining of an information bit sequence number set. A process of selecting the information bit sequence number set is described below based on characteristics of the mother code sequence provided in this embodiment of this application.

Optionally, in an embodiment, the determining, by the sending device, an information bit sequence number set from the at least one mother code sequence based on a code length of a target polar code includes:

determining, by the sending device, the information bit sequence number set from the at least one mother code sequence based on a quantity K of information bits in the target polar code or a quantity F of fixed bits in the target polar code.

In the polar encoding process, a polar code includes the following parts: information bits, fixed bits (or referred to as frozen bits), and punctured bits. For example, a mother code length of the polar code is N, and then N=K+F+P, where K is a quantity of information bits, F is a quantity of fixed bits, and P is a quantity of bits that may be punctured in a rate matching process.

In this embodiment of this application, the quantity K of the information bits is a quantity of non-fixed bits. When there is a check bit, K in this specification also includes the check bit.

Optionally, in an embodiment, the determining, by the sending device, an information bit sequence number set from the at least one mother code sequence based on a code length of a target polar code includes:

determining, by the sending device, the information bit sequence number set from the at least one mother code sequence based on a quantity K of information bits in the target polar code or a quantity F of fixed bits in the target polar code.

In this embodiment of this application, the information bit sequence number set may be determined based on the quantity K of the information bits in the target polar code or the quantity of the fixed bits in the target polar code.

It should be noted that, any sequence number in the mother code sequence in this embodiment of this application is a sequence number that is not to be punctured in the polar encoding process.

(1) The information bit sequence number set is determined based on the quantity K of the information bits.

Specifically, a manner in which the sending device determines the information bit sequence number set varies with different mother code sequences prestored in the sending device and the receiving device.

Case 1

The sending device and the receiving device prestore a maximum mother code sequence.

It should be understood that, the maximum mother code sequence herein is a mother code sequence with a maximum code length that can be supported by a communications system including the sending device and the receiving device. A code length of the maximum mother code sequence is denoted as L below. For example, L=32, 128, or 1024.

For ease of description, a detailed process of polar encoding and polar decoding provided in this application is described in the following embodiments by using L=32 as an example.

Optionally, in an embodiment, the determining, by the sending device, the information bit sequence number set from the at least one mother code sequence based on a quantity K of information bits in the target polar code includes:

selecting, by the sending device based on the quantity K of the information bits, non-punctured sequence numbers less than or equal to N from a maximum mother code sequence in the at least one mother code sequence in descending order of reliability as a mother code sequence of the target polar code; and determining, by the sending device, the information bit sequence number set based on the mother code sequence of the target polar code, where N is a mother code length of the target polar code.

It should be understood that, if sequence numbers, corresponding to polarized channels, in the mother code sequence start from 1, sequence numbers less than or equal to N should be selected. If sequence numbers, corresponding to polarized channels, in the mother code sequence start from 0, sequence numbers less than N should be selected.

For ease of description, L=32 is used as an example, sorting is performed in ascending order of reliability of polarized channels, and it is assumed that the maximum mother code sequence is:

[0, 1, 2, 4, 8], {16, 3}, {5, 6, 9, 10}, {17, 12}, {18, 20, 7, 24, 11, 13}, {19, 14}, [21, 22, 25, 26], {28, 15}, [23, 27, 29, 30, 31].

Herein, a symbol { } represents a set, and [ ] represents a sequence.

If the mother code length of the target polar code is N=16, and the quantity of the information bits is K=7:

First, non-punctured sequence numbers less than or equal to N are selected from the maximum mother code sequence in descending order of reliability, to obtain the mother code sequence with N=16 of the target polar code, that is, {15}, {14}, {7, 11, 13}, {12}, {5, 6, 9, 10}, {3}, [0, 1, 2, 4, 8]. Then the information bit sequence number set is selected from the non-punctured sequence numbers less than or equal to N. For example, if selection is performed in descending order of reliability, a sequence obtained after seven sequence numbers are selected should be {15}, {14}, {7, 11, 13}, {12}, [10]. That is, the information bit sequence number set is {15, 14, 13, 11, 7, 12, 10}.

Certainly, sequence numbers 13, 11, and 7 are in a same subset of the maximum mother code sequence, and therefore reliability of polarized channels corresponding to the three sequence numbers is not ordered. In addition, the last sequence number 10 is selected from the subsequence {5, 6, 9, 10} of the maximum mother code sequence. Because reliability of polarized channels corresponding to the sequence numbers 5, 6, 9, and 10 in the subset is not ordered, the sequence number 10 is selected in the foregoing example. For how to select a sequence number having relatively high reliability from a subset, an online computing or table reading manner may be used. The following provides a detailed description.

It may be understood that, in a process of selecting a mother code sequence of a polar code, if there is a subset having one sequence number, and a subsequence is right before the subset, the sequence number in the subset may be included in the subsequence right before the subset. Alternatively, if a subsequence is right behind a subset having one sequence number, the sequence number in the subset may be included in the subsequence right behind the subset. Certainly, if subsequences are right before and right behind the subset, the subset and the subsequences right before and behind the subset may be combined into one sequence.

For example, a mother code sequence, selected from the foregoing mother code sequence, of a target polar code is {15}, {14}, {7, 11, 13}, {12}, {5}. The subset {5} is right behind {12}. Because reliability sorting of sequence numbers of the two subsets is definite, the subsets {12} and {5} may be combined into one sequence. Therefore, the several subsequences or subsets may also be represented by {15}, {14}, {7, 11, 13}, [12, 5]. Similarly, if two adjacent subsets each have one sequence number, because soiling of the two subsets corresponds to different reliability, the two subsets may be combined into one sequence. For example, in this example, {15} and {14} may be combined into a subsequence [15, 14]. In this case, the mother code sequence of the target polar code may also be represented by [15, 14], {7, 11, 13}, [12, 5].

In another possible implementation, when selecting the information bit sequence number set from the maximum mother code sequence based on the quantity K of the information bits, the sending device may directly select, from the maximum mother code sequence, K sequence numbers less than the length of the mother code of the target polar code. A set including the K sequence numbers is the information bit sequence number set.

For example, the mother code sequence with N=32 is the maximum mother code sequence. It is assumed that the length of the mother code of the target polar code is 16, and the quantity of the information bits is 7. Then the sending device may directly select seven sequence numbers from the maximum mother code sequence in descending order of reliability, instead of first selecting a mother code sequence of the target polar code from the maximum mother code sequence, and then selecting seven sequence numbers from the mother code sequence of the target polar code in descending order of reliability as an information bit sequence number set.

For example, the sending device directly selects, in descending order of reliability, seven sequence numbers less than 16 from the maximum mother code sequence with the code length of 32. The seven sequence numbers are 15, 14, 13, 11, 7, 12, and 10 in sequence. In other words, the information bit sequence number set is {15, 14, 13, 11, 7, 12, 10}.

The foregoing mainly describes how to select a mother code sequence of a target polar code from a maximum mother code sequence. After the mother code sequence of the target polar code is determined, an information bit sequence number set may be further selected from the mother code sequence of the target polar code. The following describes how to select the information bit sequence number set from the mother code sequence of the target polar code, Case 2

The sending device and the receiving device prestore a plurality of mother code sequences rather than a maximum mother code sequence.

Optionally, in an embodiment, the determining, by the sending device, the information bit sequence number set from the at least one mother code sequence based on a quantity K of information bits in the target polar code includes:

when $K=M_1$, selecting, by the sending device in descending order of reliability, the first $M_1$ non-punctured sequence numbers from the mother code sequence of the target polar code as the information bit sequence number set, where $M_1$ is a quantity of sequence numbers in the first at least one subsequence or subset in the mother code sequence of the target polar code in descending order of reliability, $M_1 \geq 1$, and $M_1$ is an integer.

The mother code sequence with the code length of 32 is still used as an example. Herein, it is assumed that the code length of the target polar code is N=32, and the mother code sequence of the target polar code is [0, 1, 2, 4, 8], {16, 3}, {5, 6, 9, 10}, {17, 12}, {18, 20, 7, 24, 11, 13}, {19, 14}, [21, 22, 25, 26], {28, 15}, [23, 27, 29, 30, 31].

Herein, for all subsequences or subsets of the mother code sequence with N=32 of the polar code, quantities of sequence numbers in the subsequences or the subsets are denoted as $P_1, P_2, \ldots, P_i$ in ascending order of reliability. In the foregoing example, i=9, and $P_1=5, P_2=2, P_3=4$, and so on.

If the code length of the target polar code is N=32, and $K=P_9+P_8$. In other words, the quantity K of the information bits is exactly equal to a sum of quantities of sequence numbers in several subsequences or subsets sorted in descending order of reliability in the mother code sequence of the target polar code. Herein, $M_1=P_9+P_8$. In other words, a sum of quantities of all sequence numbers in several subsequences or subsets sorted in the front of the mother code sequence in descending order of reliability is exactly equal to K. Certainly, the "several" herein may be any quantity, for example, 1, 2, or n (n<N and N is an integer).

In this case, the sending device may directly use sequence numbers in the several subsequences or subsets as an information bit sequence number set. Therefore, when N=32 and K=7, the information bit sequence number set determined by the sending device is $\{I_9, I_8\}$={28, 15, 23, 27, 29, 30, 31}.

Optionally, in an embodiment, the determining, by the sending device, the information bit sequence number set from the at least one mother code sequence based on a quantity K of information bits in the target polar code includes:

when $M_1 < K \leq M_2$, selecting, by the sending device in descending order of reliability, the first $M_1$ non-punctured sequence numbers from the mother code sequence of the target polar code as a first sequence number set, where $M_1$ is a quantity of sequence numbers in the first at least one subsequence or subset in the mother code sequence of the target polar code in descending order of reliability, $M_2 > M_1$, and $M_1$ and $M_2$ are positive integers;

selecting, by the sending device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set; and determining sequence numbers in the first sequence number set and the second sequence number set as the information bit sequence number set.

In such a case, in descending order of reliability, a sum of quantities of sequence numbers in the first W subsequences or subsets in the mother code sequence is less than K, but a sum of quantities of sequence numbers in the first W+1 subsequences or subsets is greater than K. In this case, the sequence numbers in the first W subsequences or subsets in the mother code sequence are first determined as a first sequence number set. Then $(K-M_1)$ sequence numbers are selected from the $(W+1)^{th}$ subsequence or subset in descending order of reliability as a second sequence number set. Finally, the first sequence number set and the second sequence number set are combined, and an obtained set is an information bit sequence number set.

The mother code sequence with the code length of 32 is still used as an example for description.

If the mother code length of the target polar code is N=32, and K=9, $P_9+P_8<K<P_9+P_8+P_7$. In other words, the quantity K of the information bits is not a sum of quantities of sequence numbers in several subsequences or subsets in the mother code sequence.

In this case, the sending device first selects all sequence numbers in subsequences or subsets $I_9$ and $I_8$ corresponding to $P_9$ and $P_8$ as a first sequence number set. The first sequence number set is {23, 27, 29, 30, 31, 28, 15}. Then the sending device selects, from a subsequence or a subset adjacent to a subsequence or a subset having lower reliability in $I_9$ and $I_8$, $(K-P_9-P_8)$ sequence numbers having highest reliability as a second sequence number set. In the foregoing example, $I_8$ has lower reliability in $I_9$ and $I_8$, and $I_7$ is adjacent to $I_8$. Therefore, the sending device needs to select $(K-P_9-P_8)$ sequence numbers from $I_7$ as the second sequence number set.

Optionally, in an embodiment, a second subsequence is adjacent to the subsequence or the subset in which the $M_1$ non-punctured sequence numbers are located, and the selecting, by the sending device in descending order of reliability front non-punctured sequence numbers in a subsequence or a subset adjacent to a subsequence or a subset in which the $M_1$ non-punctured sequence numbers are located, $(K-M_1)$ sequence numbers as a second sequence number set includes:

selecting, by the sending device in descending order of reliability, $(K-M_1)$ sequence numbers from non-punctured sequence numbers in the second subsequence as the second sequence number set.

Specifically, if $I_7$ is a subsequence, $(K-P_9-P_8)$ sequence numbers having highest reliability are directly selected as a second sequence number set. For example, in the mother code sequence with N=32, $I_7$ is a subsequence, and then (9-5-2) sequence numbers having highest reliability are directly selected from $I_7$ as a second sequence number set. The second sequence number set is {25, 26}.

Optionally, in an embodiment, a third subset is adjacent to the subsequence or the subset in which the Mt non-punctured sequence numbers are located, and the selecting, by the sending device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes:

selecting, by the sending device in descending order of reliability in an online computing or table reading manner, $(K-M_1)$ sequence numbers from non-punctured sequence numbers in the third subset as the second sequence number set.

Specifically, if $I_7$ is a subset, the sending device needs to select, from $I_7$ in the online computing or table reading manner, (9-5-2) sequence numbers having highest reliability as a second sequence number set.

Further optionally, in an embodiment, the sending device further prestores a first sorting table, and the first sorting table records reliability sorting of the non-punctured sequence numbers in the third subset, and the selecting, by the sending device in descending order of reliability in a table reading manner, $(K-M_1)$ non-punctured sequence numbers from the third subset as the second sequence number set includes:

selecting, by the sending device in descending order of reliability, $(K-M_1)$ non-punctured sequence numbers from the first sorting table as the second sequence number set.

Specifically, if a sequence number having relatively high reliability is selected from a subset in the online computing manner, the sending device may use a construction algorithm for selection. The construction algorithm used by the sending device may be unrelated to a channel, or may be related to a code rate or a code length, and is not limited herein. Certainly, an online computing method in the prior art may also be used. For example, a Gaussian approximation algorithm and a polarization weighting construction algorithm in the prior art may be used.

If a sequence number having relatively high reliability is selected from a subset in the table reading manner, the sending device may further store a table for possible sorting in the subset. For example, different sorting of sequence numbers in the subset is stored correspondingly depending on different code lengths. During polar encoding, corresponding sorting is selected based on an actual code length. Alternatively, a table is stored depending on another factor (for example, sorting in different algorithms). This is not limited in this embodiment of this application.

For example, for the mother code sequence with N=32, a table storage manner may be used for all sequence numbers in all subsets in the mother code sequence, in which sorting of relative locations of the sequence numbers in the subsets is stored in a table.

After the second sequence number set is determined, the first sequence number set and the second sequence number set are combined into an information bit sequence number set. To be specific, the information bit sequence number set is {23, 27, 29, 30, 31, 28, 15}+{25, 26}={15, 23, 25, 26, 28, 27, 29, 30, 31}.

The following describes how to select the information bit sequence number set from the mother code sequence of the target polar code based on the quantity F of the fixed bits in the target polar code.

(2) The information bit sequence number set is determined based on the quantity F of the fixed bits.

A process of determining the information bit sequence number set based on the quantity F of the fixed bits is similar to the process of determining the information bit sequence number set based on the quantity K of the information bits. The following provides a brief description.

First described is how to select the information bit sequence number set based on F in the foregoing case 1, that is, when the sending device and the receiving device pre-store a maximum mother code sequence.

Optionally, in an embodiment, the determining, by the sending device, the information bit sequence number set from the at least one mother code sequence based on a quantity F of fixed bits in the target polar code includes:

selecting, by the sending device based on the quantity F of the fixed bits in ascending order of reliability, non-punctured sequence numbers less than or equal to N from a maximum mother code sequence in the at least one mother code sequence as a mother code sequence of the target polar code;

determining, by the sending device, a fixed bit sequence number set based on the mother code sequence of the target polar code, where N is a mother code length of the target polar code; and determining, by the sending device, a complement of the fixed bit sequence number set relative to a set including sequence numbers in the mother code sequence of the target polar code as the information bit sequence number set.

It may be understood that, when the sending device and the receiving device store a maximum mother code sequence, the sending device first selects, from the maximum mother code sequence in ascending order of reliability, non-punctured sequence numbers less than or equal to N as a mother code sequence of the target polar code, then determines a fixed bit sequence number set from the mother code sequence of the target polar code, and finally determines a complement of the fixed bit sequence number set relative to a set including sequence numbers in the mother code sequence of the target polar code as the information bit sequence number set.

An example is used below for description.

That a length of the maximum mother code sequence is L=32 is still used as an example. It is assumed that the maximum mother code sequence is:

[0, 1, 2, 4, 8], {16, 3}, {5, 6, 9, 10}, {17, 12}, {18, 20, 7, 24, 11, 13}, {19, 14}, [21, 22, 25, 26], {28, 15}, [23, 27, 29, 30, 31].

If the mother code length of the target polar code is N=16, and the quantity of the fixed bits is F=7:

First, non-punctured sequence numbers less than or equal to N are selected from the maximum mother code sequence, and are sorted in ascending order of reliability, to obtain a mother code sequence of the target polar code, that is, [0, 1, 2, 4, 8], {3}, {5, 6, 9, 10}, {12}, {7, 11, 13}, {14}, {15}. Then seven sequence numbers are selected from the mother code sequence in ascending order of reliability, to obtain a sequence number set (denoted as a set C) That is, the set C={[0, 1, 2, 4, 8], {3}, {5, 6}}={0, 1, 2, 4, 8, 3, 5, 6}. Herein, a set including all sequence numbers in the mother code sequence of the target polar code is denoted as a set D, and the set D={0, 1, 2, 4, 8, 3, 5, 6, 9, 10, 12, 7, 11, 13}. Finally, a complement of the set C relative to the set D is determined as an information bit sequence number set. In this case, the information bit sequence number set is {5, 6, 9, 10, 12, 7, 11, 13, 14, 15}.

In another possible implementation, when selecting the fixed bit sequence number set from the maximum mother code sequence based on the quantity F of the fixed bits, the sending device may directly select, from the maximum mother code sequence in ascending order of reliability, F sequence numbers less than the length of the mother code of the target polar code, where the set including the F sequence numbers is the fixed bit sequence number set, instead of first selecting a mother code sequence of the target polar code from the maximum mother code sequence, and then selecting F sequence numbers from the mother code sequence of the target polar code in ascending order of reliability as a fixed bit sequence number set.

For example, the sending device directly selects, in ascending order of reliability, seven sequence numbers less than 16 from the maximum mother code sequence with the code length of 32. The seven sequence numbers are 0, 1, 2, 4, 8, 3, and 5 in sequence. In other words, the fixed bit sequence number set is {0, 1, 2, 4, 8, 3, 5}.

Then described is how to select the information bit sequence number set based on F in the foregoing case 2, that is, when the sending device and the receiving device pre-store a plurality of mother code sequences rather than a maximum mother code sequence.

Optionally, in an embodiment, the determining, by the sending device, the information bit sequence number set from the at least one mother code sequence based on a quantity F of fixed bits in the target polar code includes:

when $F=M_3$, selecting, by the sending device in ascending order of reliability, the first $M_3$ non-punctured sequence numbers from the mother code sequence of the target polar code as a fixed bit sequence number set, where $M_3$ is a quantity of sequence numbers in the first at least one subsequence or subset in the mother code sequence of the target polar code in ascending order of reliability, $M_3 \geq 1$, and $M_3$ is an integer; and determining, by the sending device, a complement of the fixed bit sequence number set relative to a set including sequence numbers in the mother code sequence of the target polar code as the information bit sequence number set.

Actually, a process of selecting the information bit sequence number set from the mother code sequence of the target polar code based on the quantity F of the fixed bits in the target polar code is the same as the process, in the foregoing embodiment, of selecting the mother code sequence of the target polar code from the maximum mother code sequence and then selecting the information bit sequence number set from the mother code sequence.

The mother code sequence with the code length of 32 is used as an example for description.

Herein, quantities of sequence numbers in subsequences or subsets included in the mother code sequence of the target polar code are sequentially denoted as $P_1, P_2, \ldots, P_n$ in ascending order of reliability of polarized channels.

That is, if $F=M_3=P_1+P_2+\ldots+P_i$ (i=1, 2, ..., n), it may be determined that a fixed bit set is $\{I_1, I_2, \ldots, I_i\}$. A complement of the fixed bit set relative to a set including all the sequence numbers in the mother code sequence is an information bit sequence number set.

For example, N=32, and F=13. In this case, a complement of the fixed bit set (denoted as the set C) C={[0, 1, 2, 4, 8], {16, 3}, {5, 6, 9, 10}, {17, 12}} relative to the mother code sequence is an information bit sequence number set. The information bit sequence number set is {7, 11, 13, 14, 15, 18, 19, 20, 21, 22, 23, 24, 25, 26, 27, 28, 29, 30, 31}.

Optionally, in an embodiment, the determining, by the sending device, the information bit sequence number set from the at least one mother code sequence based on a quantity F of fixed bits in the target polar code includes:

when $M_3 < F \leq M_4$, selecting, by the sending device in ascending order of reliability, the first $M_3$ non-punctured sequence numbers from the mother code sequence of the target polar code as a third sequence number set, where $M_3$ is a quantity of sequence numbers in the first at least one subsequence or subset in the mother code sequence of the target polar code in ascending order of reliability, $M_4 > M_3$, and $M_3$ and $M_4$ are positive integers;

selecting, by the sending device in ascending order of reliability from a subsequence or a subset adjacent to a subsequence or a subset in which the $M_3$ non-punctured sequence numbers are located, $(F-M_3)$ sequence numbers as a fourth sequence number set;

determining, by the sending device, sequence numbers in the third sequence number set and the fourth sequence number set as a fixed bit sequence number set; and determining, by the sending device, a complement of the fixed bit sequence number set relative to a set including sequence numbers in the mother code sequence of the target polar code as the information bit sequence number set.

That is, if $M_3 < F < M_4$ and $M_3 = P_1 + P_2 + \ldots P_i$, $M_4 = P_1 + P_2 + \ldots P_i + P_{i+1}$.

Specifically, the sending device may use different selection methods depending on whether $I_{i+1}$ corresponding to $P_{i+1}$ is a subsequence or a subset.

If $I_{i+1}$ is a subsequence, the sending device may select all non-punctured sequence numbers from $I_1, I_2 \ldots, I_i$, then select $(F-P_1-P_2- \ldots P_i = F-M_3)$ non-punctured sequence numbers having lowest reliability from $I_{i+1}$, and combine the sequence numbers into a fixed bit sequence number set Finally, the sending device determines a complement of the fixed bit sequence number set relative to a set including all sequence numbers in the mother code sequence as an information bit sequence number set.

If $I_{i+1}$ is a subset, the sending device may first select all non-punctured sequence numbers from $I_1, I_2 \ldots, I_i$. This process is the same as the process in a case in which $I_{i+1}$ is a subsequence. A difference lies in that when $(F-M_3)$ non-punctured sequence numbers are selected from the subset $I_{i+1}$, because reliability of polarized channels corresponding to sequence numbers in the subset $I_{i+1}$ is not ordered, the sending device needs to select the $(F-M_3)$ non-punctured sequence numbers from the subset in $I_{i+1}$ an online computing or table reading manner. Finally, the selected $(F-M_3)$ non-punctured sequence numbers and all the non-punctured sequence numbers selected from it, $I_1, I_2 \ldots, I_i$ are combined into a fixed bit sequence number set.

Optionally, in an embodiment, a fourth subset is adjacent to the subsequence or the subset in which the $M_3$ non-punctured sequence numbers are located, and the selecting, by the sending device in ascending order of reliability from a subsequence or a subset adjacent to a subsequence or a subset in which the $M_3$ non-punctured sequence numbers are located, $(F-M_3)$ sequence numbers as a fourth sequence number set includes:

selecting, by the sending device in ascending order of reliability in an online computing or table reading manner. $(F-M_3)$ sequence numbers from non-punctured sequence numbers in the fourth subset as the fourth sequence number set.

For the online computing or table reading manner used herein, refer to the foregoing description of determining an information bit sequence number set based on a quantity K of information bits. Details are not described herein again.

Optionally, in an embodiment, the sending device further prestores a second sorting table, and the second sorting table records reliability sorting of the non-punctured sequence numbers in the fourth subset, and the selecting, by the sending device in ascending order of reliability in a table reading manner, $(F-M_3)$ sequence numbers from non-punctured sequence numbers in the fourth subset as the fourth sequence number set includes:

selecting, by the sending device in ascending order of reliability, $(F-M_3)$ non-punctured sequence numbers from the second sorting table as the fourth sequence number set.

130. The sending device performs polar encoding on information bits based on the information bit sequence number set.

In step 130, the sending device performs polar encoding on the information bit based on the selected information bit sequence number set, to obtain an encoded sequence. Step 130 may be the same as the prior art, and is not limited herein.

It should be understood that, the information bits herein are to-be-encoded bits that the sending device needs to send to the receiving device. The encoded sequence is a code word obtained after polar encoding is performed on the to-be-encoded bits.

Subsequently, the sending device sends the encoded sequence to the receiving device. Correspondingly, the receiving device performs steps 140 and 150.

140. The receiving device obtains a to-be-decoded sequence.

150. The receiving device decodes the to-be-decoded sequence based on the code length of the target polar code and the at least one mother code sequence.

It should be understood that, the sending device performs polar encoding on the information bits, to obtain the encoded sequence. The encoded sequence is sent by the sending device, and then a sequence received by the receiving device is the to-be-decoded sequence.

In step 150, after correctly decoding the to-be-decoded sequence, the receiving device obtains the information bits.

It may be understood that, the sending device and the receiving device prestore same mother code sequence information. Moreover, a mother code sequence and an encoding parameter that are used for a polar code of each code length are pre-agreed on by the sending device and the receiving device. Therefore, after obtaining the to-be-decoded sequence (or to-be-decoded code word), the receiving device may obtain, through correct decoding by using a cyclic redundancy check (CRC), the information bits sent by the sending device to the receiving device.

Actually, a process of decoding the obtained to-be-decoded sequence by the receiving device is exactly inverse to the process of performing polar encoding on the information bit based on the information bit sequence number set by the sending device. Because fixed bits are pre-agreed on by the sending device and the receiving device, that is, are known, a key to the process of decoding the to-be-decoded sequence by the receiving device is determining the information bit sequence number set.

Optionally, in an embodiment, the decoding, by the receiving device, the to-be-decoded sequence based on the code length of the target polar code and the at least one mother code sequence includes: determining, by the receiving device, an information bit sequence number set based on the at least one mother code sequence and a quantity K of information bits in the target polar code or a quantity F of fixed bits in the target polar code; and decoding, by the receiving device, the to-be-decoded sequence based on the information bit sequence number set.

(1) The receiving device determines the information bit sequence number set based on the quantity K of the information bits.

Optionally, in an embodiment, the determining, by the receiving device, the information bit sequence number set based on the mother code sequence of the target polar code includes:

when $K=M_1$, selecting, by the receiving device in descending order of reliability, the first $M_1$ non-punctured sequence numbers from the mother code sequence of the target polar code as the information bit sequence number set, where $M_1$ is a quantity of sequence numbers in the first at least one subsequence or subset in the mother code sequence of the target polar code in descending order of reliability, $M_1 \geq 1$ and $M_1$ is an integer.

Optionally, in an embodiment, the determining, by the receiving device, the information bit sequence number set based on the mother code sequence of the target polar code includes:

when $M_1 < K \leq M_2$, selecting, by the receiving device in descending order of reliability, the first $M_1$ non-punctured sequence numbers from the mother code sequence of the target polar code as a first sequence number set, where $M_1$ is a quantity of sequence numbers in the first at least one subsequence or subset in the mother code sequence of the target polar code in descending order of reliability, $M_2 > M_1$, and $M_1$ and $M_2$ are positive integers;

selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set; and determining, by the receiving device, sequence numbers in the first sequence number set and the second sequence number set as the information bit sequence number set.

Optionally, in an embodiment, a third subset is adjacent to the subsequence or the subset in which the $M_1$ non-punctured sequence numbers are located, and the selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes:

selecting, by the receiving device in descending order of reliability in an online computing or table reading manner, $(K-M_1)$ sequence numbers from non-punctured sequence numbers in the third subset as the second sequence number set; and determining, by the receiving device, the first sequence number set and the second sequence number set as the information bit sequence number set.

Optionally, in an embodiment, a second subsequence is adjacent to the subsequence or the subset in which the $M_1$ non-punctured sequence numbers are located, and the selecting, by the receiving device in descending order of reliability from non-punctured sequence numbers in a subsequence or a subset adjacent to a subsequence or a subset in which the $M_1$ non-punctured sequence numbers are located, $(K-M_1)$ sequence numbers as a second sequence number set includes:

selecting, by the receiving device in descending order of reliability, $(K-M_1)$ sequence numbers from non-punctured sequence numbers in the second subsequence as the second sequence number set.

Optionally, in an embodiment, the receiving device further prestores a first sorting table, and the first sorting table records reliability sorting of the non-punctured sequence numbers in the third subset, and the selecting, by the receiving device in descending order of reliability in an online computing or table reading manner, $(K-M_1)$ sequence numbers from non-punctured sequence numbers in the third subset as the second sequence number set includes:

selecting, by the receiving device in descending order of reliability, $(K-M_1)$ non-punctured sequence numbers from the first sorting table as the second sequence number set.

Specifically, in the foregoing embodiment, a process of determining, by the receiving device, the information bit sequence number set from the prestored at least one mother code sequence based on the quantity K of the information bits is the same as the foregoing process of determining, by the sending device, the information bit sequence number set based on the quantity K of the information bits. Therefore, reference may be made to the foregoing description, and details are not described herein again.

(2) The receiving device determines the information bit sequence number set based on the quantity F of the fixed bits.

Optionally, in an embodiment, the determining, by the receiving device, the information bit sequence number set from the at least one mother code sequence based on a quantity F of fixed bits in the target polar code includes:

when $F=M_3$, selecting, by the receiving device in ascending order of reliability, the first $M_3$ non-punctured sequence numbers from the mother code sequence of the target polar code as a fixed bit sequence number set, where $M_3$ is a quantity of sequence numbers in the first at least one subsequence or subset in the mother code sequence of the target polar code in ascending order of reliability, $M_3 \geq 1$, and $M_3$ is an integer; and determining, by the receiving device, a complement of the fixed bit sequence number set relative to a set including sequence numbers in the mother code sequence of the target polar code as the information bit sequence number set.

Optionally, in an embodiment, the determining, by the receiving device, the information bit sequence number set from the at least one mother code sequence based on a quantity F of fixed bits in the target polar code includes:

when $M_3 < F \leq M_4$, selecting, by the receiving device in ascending order of reliability, the first $M_3$ non-punctured sequence numbers from the mother code sequence of the target polar code as a third sequence number set, where $M_3$ is a quantity of sequence numbers in the first at least one subsequence or subset in the mother code sequence of the target polar code in ascending order of reliability, $M_4 > M_3$, and $M_3$ and $M_4$ are positive integers;

selecting, by the receiving device in ascending order of reliability from a subsequence or a subset adjacent to a subsequence or a subset in which the $M_3$ non-punctured sequence numbers are located, $(F-M_3)$ sequence numbers as a fourth sequence number set;

determining, by the receiving device, sequence numbers in the third sequence number set and the fourth sequence number set as a fixed bit sequence number set; and determining, by the receiving device, a complement of the fixed bit sequence number set relative to a set including sequence numbers in the mother code sequence of the target polar code as the information bit sequence number set.

Optionally, in an embodiment, a fourth subset is adjacent to the subsequence or the subset in which the $M_3$ non-punctured sequence numbers are located, and the selecting, by the receiving device in ascending order of reliability from a subsequence or a subset adjacent to a subsequence or a subset in which the $M_3$ non-punctured sequence numbers are located, $(F-M_3)$ sequence numbers as a fourth sequence number set includes:

selecting, by the receiving device in ascending order of reliability in an online computing or table reading manner, $(F-M_3)$ sequence numbers from non-punctured sequence numbers in the fourth subset as the fourth sequence number set.

Optionally, in an embodiment, the receiving device further prestores a second sorting table, and the second sorting table records reliability sorting of the non-punctured sequence numbers in the fourth subset, and the selecting, by the receiving device in ascending order of reliability in a table reading manner, $(F-M_3)$ sequence numbers from non-punctured sequence numbers in the fourth subset as the fourth sequence number set includes:

selecting, by the receiving device in ascending order of reliability, $(F-M_3)$ non-punctured sequence numbers from the second sorting table as the fourth sequence number set.

Similarly, a process of determining, by the receiving device, the information bit sequence number set from the prestored at least one mother code sequence based on the quantity F of the fixed bits is the same as the foregoing process of determining, by the sending device, the information bit sequence number set based on the quantity F of the fixed bits. Therefore, for a detailed process in the foregoing embodiment, refer to the foregoing description of determining, by the sending device, the information bit sequence number set from the prestored at least one mother code sequence based on the quantity F of the fixed bits. Details are not described herein again.

The following is an example of a mother code sequence provided in an embodiment of this application, with a code length of 1024. The mother code sequence is shown as follows:

[0, 1, 2, 4, 8, 16, 3, 32, 5, 6, 9, 64, 10, 17, 12, 18, 128, 33, 20, 34, 7, 24, 36, 65, 11, 256, 66, 40, 13, 19, 68, 14, 129, 48, 21, 72, 130, 35, 22], {25, 512}, [132], {37, 80}, [26], {38, 257, 67, 136}, [41, 28, 258, 96, 69, 42], {15, 144, 49, 260}, [70, 44, 73, 131, 50], {23, 264, 74, 160, 513}, [133, 52, 81], {27, 76, 514, 134, 39, 272, 82}, [137, 56], {29, 516, 259, 192}, [97, 138, 84, 43], {30, 145, 288, 98, 261, 71, 520, 140, 45, 88}, [146], {51, 262}, [100], {46, 265, 75, 161, 528, 148, 53, 320}, [266, 104], {77, 162, 515, 135, 54, 273, 83, 152, 57, 268, 78, 544, 164, 517}, [274, 193, 112, 139, 85, 58], {31, 518, 384, 289}, [194], {99, 276, 168, 86, 521}, [141], {60, 89, 147}, [290], {576, 263, 196, 101, 522, 142, 47, 280, 90, 176, 529, 149, 292, 102, 321, 524, 267, 200, 105, 92, 163, 530, 150, 55, 322, 153, 296, 106, 269, 79, 640, 545, 165, 532, 275, 208, 113, 154, 324, 59, 270, 108, 546, 166, 519, 385, 304, 195, 114, 277, 169, 87, 536, 156, 61, 328, 548, 386, 291, 224, 577}, [278, 197], {170, 116, 523, 143, 62, 281, 91, 177, 768, 578, 388, 293, 198, 103, 552, 336, 172, 525}, [282, 201, 120], {93, 178, 531, 151}, [294], {580, 323, 526, 392, 297, 202, 107, 284, 94, 641, 560, 180, 533, 209, 352, 155, 325, 298, 584, 271, 204, 109, 642, 547, 167, 534, 400, 305, 210, 115, 184, 326, 537, 157, 300, 110, 329, 644, 549, 387, 306, 225, 592, 279, 212, 171, 117, 538, 158, 63, 330, 550, 416, 769, 226, 579, 389, 308, 199, 648, 118, 553, 337, 173, 540, 283, 216, 121, 332, 179, 770, 608, 390, 295, 228, 581, 554, 338, 174, 527, 393, 312, 203, 122, 285, 95, 656, 561, 181, 772, 582, 448, 353}, [556, 394, 340]. {299, 232, 585, 286, 205, 124, 643, 562, 182, 535, 401, 211, 354, 185, 327, 776, 586, 396, 301, 206, 111, 672, 344, 645, 564, 402, 307, 240, 593, 213, 186, 356, 539, 159, 302, 588, 331, 646, 551, 417, 784, 227, 594, 404, 309, 214, 649, 119, 568, 188, 541, 217, 360, 333, 418, 771, 704, 609, 391, 310, 229, 650, 596}, [555], {339, 175, 542, 408, 313, 218, 123, 334, 657, 800, 610, 420, 773, 230, 583, 449, 368, 652, 557, 395, 341, 314, 233, 600, 287, 220, 125, 658, 563, 183, 774, 612, 450, 355, 558, 424, 342, 777, 234, 587, 397, 316, 207, 126, 673, 345, 660, 565, 403, 241, 832, 452, 187, 357, 778, 616, 398, 303, 236, 589, 674, 346, 647, 566, 432, 785, 242, 595, 405, 215, 664, 358, 569, 189, 780, 590, 456, 361, 676, 348, 419, 786, 705, 624, 406, 311, 244, 651, 597, 570, 190, 543, 409, 219, 362, 335, 896, 801, 706, 611, 421, 788, 231, 680, 598, 464, 369, 653}, [572, 410], {315, 248, 601, 221, 364, 659, 802, 422, 775, 708}, [613, 451], {370, 654, 559, 425, 343, 792, 235, 602, 412, 317, 222, 127, 688, 661, 804, 614, 480, 833, 453, 426, 372, 779, 712, 617, 399, 318, 237, 604, 675, 347, 662, 567, 433, 243, 834, 454, 665, 359, 808, 618, 428, 781, 238, 591, 457, 376, 677, 349, 434, 787, 720, 625, 407, 245, 666, 836, 571, 191, 782, 620, 458, 363, 678, 350, 897, 816, 707, 626, 436, 789, 246, 681, 599, 465, 668, 573, 411, 249, 840, 460, 365, 898, 803, 736, 423, 790, 709, 682, 628, 466, 371, 655, 574, 440, 793, 250, 603, 413, 223, 366, 689, 900, 805, 710, 615, 481, 848, 684}, [468], {427, 373, 794, 713, 632, 414, 319, 252, 605, 690, 663, 806, 482, 835, 455, 904, 374, 809, 714, 619, 429, 796, 239, 606, 472, 377, 692, 435, 721, 864, 484, 667, 837, 810, 430, 783, 716, 621, 459, 378, 679, 351, 912, 817, 722, 627, 437, 247, 696, 838, 669, 812, 622, 488, 841, 461, 380, 899, 818, 737, 438, 791, 724}, [683, 629, 467], {670, 575, 441, 251, 842, 462, 367, 928, 738, 901, 820, 711, 630, 496, 849, 685, 469, 442, 795, 728, 633, 415, 253, 844, 691, 902, 807, 740, 483, 850, 686, 470, 905, 375, 824, 715, 634, 444, 797, 254, 607, 473, 693, 960, 865, 485, 906, 852, 811, 744, 431, 798, 717, 636, 474, 379, 694, 913, 723, 866, 486, 697, 839, 908, 813, 718, 623, 489, 856, 476, 381, 914, 819, 752, 439, 725, 698, 868, 671, 814, 490, 843, 463, 382, 929, 739, 916, 821, 726, 631, 497, 700, 443}. [729], {872, 492, 845, 930}, [903, 822, 741]. {498, 685, 687, 471, 920, 825, 730, 635, 445, 255, 846, 932, 742, 961, 880, 500, 907, 853}, [826, 745], {446, 799, 732, 637, 475, 695, 962, 867, 487, 936, 854, 746, 909, 828, 719, 638, 504, 857, 477, 915, 753, 964, 699, 869, 910, 815, 748, 491, 858, 478, 383, 944, 754, 917, 727, 870, 701, 968, 873, 493, 860, 931, 918, 823, 756, 499, 702, 921, 731, 874, 494, 847, 933, 743, 976, 881, 501, 922, 827, 760, 447}, [733], {876, 934, 963}, [882], {502, 937, 855, 747, 924}, [829], {734, 639, 505, 992}, [965, 938, 884, 911, 830, 749], {506, 859, 479, 945, 755, 966, 871, 940, 750, 969, 888, 508, 861, 946}, [919, 757], {703, 970, 875, 495, 862, 948, 758, 977}, [923], {761, 972}, [877], {935, 978, 883, 503, 952, 762, 925, 735, 878, 993}, [980, 939, 885, 926], {831, 764, 507, 994}, [967, 886], {941, 751, 984, 889, 509, 947, 996}, [942, 971, 890], {510, 863, 949, 759, 1000}, [973, 892, 950, 979, 953], {763, 974, 879, 1008}, [981, 954, 927, 765, 995, 982], {887, 956, 766, 985}, [997], {943, 986}, [891], {511, 998}, [1001, 988, 893, 951, 1002, 975, 894, 1009, 955, 1004, 1010, 983, 957, 767, 1012, 958, 987, 999, 1016, 989, 1003, 990, 895, 1005, 1011, 1006, 1013, 959, 1014, 1017, 1018, 991, 1020, 1007, 1015, 1019, 1021, 1022, 1023].

As shown in the foregoing mother code sequence, { } in the mother code sequence represents a subset, and [ ] represents a subsequence. For a detailed description of the mother code sequence, refer to the foregoing description.

In the technical solution provided in this embodiment of this application, a mother code sequence of a polar code including a sequence and a set that are interleaved is provided, so that in a process of performing polar encoding and decoding by using a mother code sequence in such a form, a half-computing and half-storage manner may be used to select information bits (that is, determine an information bit sequence number set). Therefore, a polar code sequence is constructed more flexibly. In addition, disadvantages in aspects such as transmission of medium and small data packets, reliability, complexity, and a code rate in the prior art are overcome to some extent.

The polar encoding and decoding method provided in the embodiments of this application is described above in detail with reference to FIG. 1 and FIG. 2. A sending device and a receiving device provided in the embodiments of this application are described below with reference to FIG. 3 to FIG. 6.

Figure 3:
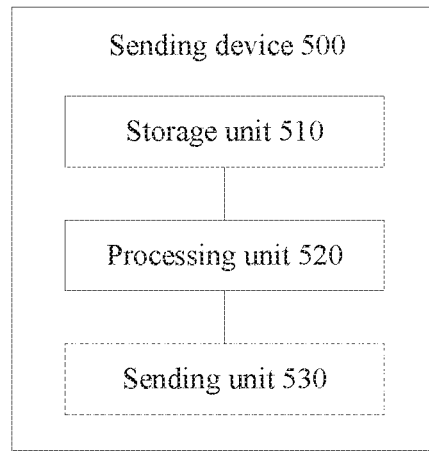
FIG. 3 is a schematic block diagram of a sending device according to an embodiment of this application.

FIG. 3 is a schematic block diagram of a sending device 500 according to an embodiment of this application. Referring to FIG. 3, the sending device 500 includes:

a storage unit 510, configured to prestore at least one mother code sequence, where each mother code sequence includes at least one subsequence and at least one subset, an element in each subsequence or subset is a sequence number of a polarized channel, each subsequence or subset includes at least one sequence number, and relative locations of sequence numbers in each subsequence are arranged in order of reliability of polarized channels; and a processing unit 520, configured to determine an information bit sequence number set from the at least one mother code sequence based on a code length of a target polar code, where the processing unit 520 is further configured to perform polar encoding on information bits based on the information bit sequence number set.

The units in the sending device 500 provided in this embodiment of this application and the foregoing other operations or functions are separately intended to implement a corresponding procedure performed by a sending device in the polar encoding and decoding method 100 provided in the foregoing embodiment of this application. For brevity, details are not described herein again.

Optionally, the sending device may further include a sending unit 530, configured to send an encoded sequence to a receiving device.

Figure 4:
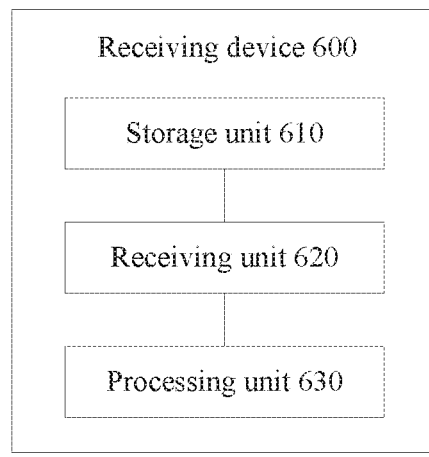
FIG. 4 is a schematic block diagram of a receiving device according to an embodiment of this application.

FIG. 4 is a schematic block diagram of a receiving device 600 according to an embodiment of this application. Referring to FIG. 4, the receiving device 600 includes:

a storage unit 610, configured to prestore at least one mother code sequence, where each mother code sequence includes at least one subsequence and at least one subset, an element in each subsequence or subset is a sequence number of a polarized channel, each subsequence or subset includes at least one sequence number, and relative locations of sequence numbers in each subsequence are arranged in order of reliability of polarized channels;

a receiving unit 620, configured to obtain a to-be-decoded sequence; and a processing unit 630, configured to decode the to-be-decoded sequence based on a code length of a target polar code and the at least one mother code sequence.

The units in the receiving device 600 provided in this embodiment of this application and the foregoing other operations or functions are separately intended to implement a corresponding procedure performed by a receiving device in the polar encoding and decoding method 100 provided in the foregoing embodiment of this application. For brevity, details are not described herein again.

Figure 5:
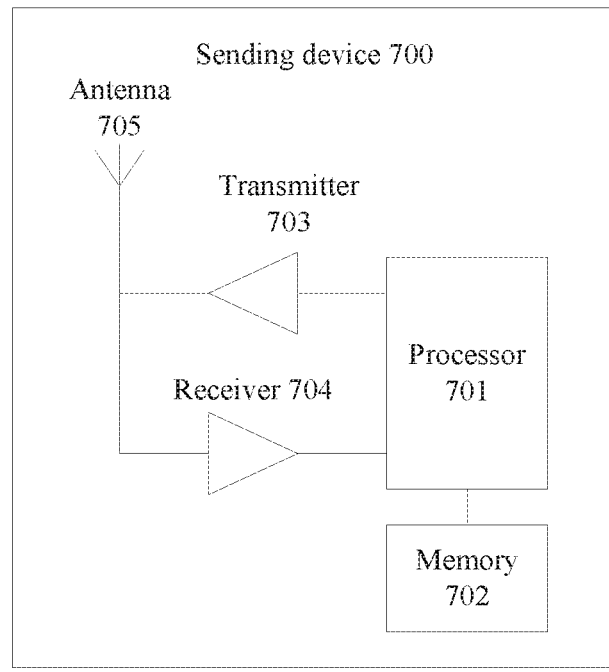
FIG. 5 is a schematic structural diagram of a sending device according to an embodiment of this application.

FIG. 5 is a schematic structural diagram of a sending device 700 according to an embodiment of this application. As shown in FIG. 5, the sending device 700 includes one or more processors 701, one or more memories 702, and one or more transceivers (each transceiver includes a transmitter 703 and a receiver 704). The transmitter 703 or the receiver 704 is connected to one or more antennas 705, and sends or receives a signal by using the one or more antennas. The memory 702 stores a computer program instruction (or code). The processor 701 executes the computer program instruction stored in the memory 702, to implement a corresponding procedure and/or operation performed by a sending device in the polar encoding and decoding method 100 provided in the foregoing embodiment of this application. For brevity, details are not described herein again.

It should be noted that, the sending device 500 shown in FIG. 3 may be implemented by using the sending device 700 shown in FIG. 5. For example, the storage unit 510 shown in FIG. 3 may be implemented by using the memory 702. The processing unit 520 may be implemented by using the processor 701. The sending unit 530 may be implemented by using the transmitter 703.

Optionally, the memory 702 may be independent, or may be integrated with the processor 701. When the processor 701 is implemented by using hardware, for example, may be a logical circuit or an integrated circuit, and connected to other hardware by using an interface, the memory 702 may not be needed.

Figure 6:
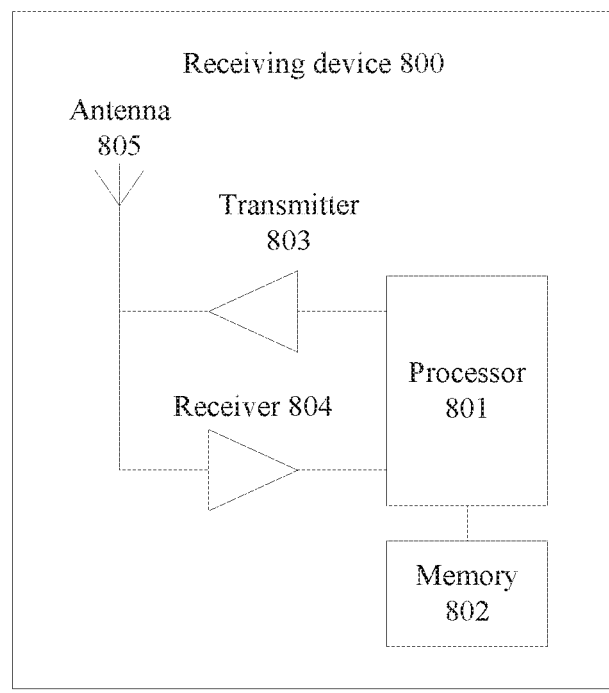
FIG. 6 is a schematic structural diagram of a receiving device according to an embodiment of this application.

FIG. 6 is a schematic structural diagram of a receiving device 800 according to an embodiment of this application. As shown in FIG. 6, the receiving device 800 includes one or more processors 801, one or more memories 802, and one or more transceivers (each transceiver includes a transmitter 803 and a receiver 804). The transmitter 803 or the receiver 804 is connected to one or more antennas 805, and sends or receives a signal by using the one or more antennas. The memory 802 stores a computer program instruction (or code). The processor 801 executes the computer program instruction stored in the memory 802, to implement a corresponding procedure and/or operation performed by a receiving device in the polar encoding and decoding method 100 provided in the foregoing embodiment of this application. For brevity, details are not described herein again.

Optionally, the memory 802 may be independent, or may be integrated with the processor 801. When the processor 801 is implemented by using hardware, for example, may be a logical circuit or an integrated circuit, and connected to other hardware by using an interface, the memory 802 may not be needed.

Similarly, the receiving device 600 shown in FIG. 4 may be implemented by using the receiving device 800 shown in FIG. 6. For example, the storage unit 610 shown in FIG. 4 may be implemented by using the memory 802. The receiving unit 620 may be implemented by using the receiver 804 shown in FIG. 6. The processing unit 630 may be implemented by using the processor 801.

In the foregoing embodiments, a processor may be a central processing unit (CPU), a microprocessor, an application-specific integrated circuit (ASIC), or one or more integrated circuits configured to control program execution of a solution in this application. For example, the processor may include a digital signal processor device, a microprocessor device, an analog-to-digital converter, or a digital-to-analog converter. The processor may distribute control and signal processing functions of a mobile device among these devices based on respective functions of these devices. In addition, the processor may include a function of operating one or more software programs, and the one or more software programs may be stored in a memory.

The memory may be a read-only memory (ROM) or another type of static storage device, a random access memory (RAM) or another type of dynamic storage device capable of storing information and instructions, or may be an electrically erasable programmable read-only memory (EEPROM), a compact disc read-only memory (CD-ROM) or another compact disc storage, an optical disc storage (including a compressed optical disc, a laser disc, an optical disc, a digital universal optical disc, a blue-ray optical disc, and the like), a magnetic disk storage medium or another magnetic storage device, or any other medium capable of carrying or storing expected program code in a form of instructions or data structures and capable of being accessed by a computer, but is not limited thereto. The memory may be independent, or may be integrated with the processor.

A transceiver may include, for example, an infrared transceiver, a transceiver, a wireless universal serial bus (USB) transceiver, or a Bluetooth transceiver. Although not shown, the sending device and the receiving device can send a signal (or data) by using the transmitter and/or receive a signal (data) by using the receiver, by using a corresponding communications technology.

A person of ordinary skill in the art may be aware that, the units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the system, apparatus, and unit, reference may be made to a corresponding process in the method embodiments. Details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected depending on actual needs to achieve the objectives of the solutions of the embodiments.

In addition, functional units in the embodiments of this application may be integrated into one processing unit, or each of the units may exist alone physically, or two or more units may be integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present invention. The storage medium includes any medium that can store program code, such as a USB flash drive, a removable hard disk, a (ROM), a (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of the present invention shall be subject to the protection scope of the claims.

What is claimed is:

1. A polar encoding method, wherein the method comprises:
obtaining, by a communications apparatus, K information bits;
determining, by the communications apparatus, a length N of a first mother code sequence of a target polar code based on K, where K<N, $N=2^n$, and n is a positive integer, wherein the first mother code sequence comprises N sequence numbers corresponding to N polarized channels, wherein the N sequence numbers are arranged in an order that reliabilities of their corresponding N polarized channels are in an ascending order, the N sequence numbers are N different integers selected from 0 to N−1;
determining, by the communications apparatus, a set of information bit sequence numbers corresponding to the K information bits of the target polar code, by selecting K sequence numbers based on reliabilities of corresponding polarized channels from the first mother code sequence, wherein the first mother code sequence is same as a sequence obtained by removing sequence numbers greater than or equal to N from a maximum mother code sequence, the maximum mother code sequence is pre-stored by the communications apparatus and comprises $N_{max}$ sequence numbers corresponding to $N_{max}$ polarized channels, the $N_{max}$ sequence numbers are $N_{max}$ different integers selected from 0 to $N_{max}-1$, the $N_{max}$ sequence numbers are arranged in an order that reliabilities of their corresponding $N_{max}$ polarized channels are in an ascending order, and N is less than or equal to $N_{max}$; and
performing, by the communications apparatus, polar encoding on information bits based on the set of information bit sequence numbers $$x_1^N = u_1^N \cdot F_N$$

wherein $u_1^N=(u_1, u_2, u_3, \ldots u_N)$ is a binary row vector with a length of N, the K information bits are carried in $u_1^N$ according to the set of information bit sequence numbers, $F_N = F_2^{\otimes(\log_2 N)}$, where $$F_2 = \begin{bmatrix} 1 & 0 \\ 1 & 1 \end{bmatrix} \text{ and } F_2^{\otimes(\log_2 N)}$$

is a Kronecker product of $\log_2 N$ $F_2$ matrices.

2. The method according to claim 1, wherein the K information bits comprises check bits.

3. The method according to claim 1, wherein $N_{max}=1024$.

4. The method according to claim 3, wherein sequence number 194 is located in a $137^{th}$ location of the maximum mother code sequence.

5. The method according to claim 3, wherein
a sequence number of the first mother code sequence with a length of 512 selected from the maximum mother code sequence satisfies at least one of:
   sequence number 146 is located in a $94^{th}$ location of the first mother code sequence with a length of 512;
   sequence number 468 is located in $427^{th}$ location of the first mother code sequence with a length of 512;
   sequence number 505 is located in $502^{nd}$ location of the first mother code sequence with a length of 512;
   sequence number 495 is located in $506^{th}$ location of the first mother code sequence with a length of 512;
   sequence number 503 is located in $507^{th}$ location of the first mother code sequence with a length of 512;
   sequence number 507 is located in $508^{th}$ location of the first mother code sequence with a length of 512;
   sequence number 509 is located in $509^{th}$ location of the first mother code sequence with a length of 512;
   sequence number 510 is located in $510^{th}$ location of the first mother code sequence with a length of 512;
   sequence number 511 is located in $511^{st}$ location of the first mother code sequence with a length of 512; or
   locations, in the first mother code sequence with the length of 512, of a subset of sequence numbers {506, 479, 508} are {503, 504, 505};
a sequence number of the first mother code sequence with a length of 256 selected from the maximum mother code sequence satisfies at least one of:
   sequence number 100 is located in $87^{th}$ location of the first mother code sequence with a length of 256; or
   sequence number 255 is located in $255^{th}$ location of the first mother code sequence with a length of 256;
a sequence number of the first mother code sequence with a length of 128 selected from the maximum mother code sequence satisfies at least one of:
   sequence number 93 is located in $109^{th}$ location of the first mother code sequence with a length of 128;
   sequence number 127 is located in $127^{th}$ location of the first mother code sequence with a length of 128;
   locations, in the first mother code sequence with the length of 128, of a subset of sequence numbers {30, 98, 71, 45, 88} are {65, 66, 67, 68, 69}; or
   locations, in the first mother code sequence with the length of 128, of a subset of sequence numbers {123, 125, 126} are {124, 125, 126};
a sequence number of the first mother code sequence with a length of 64 selected from the maximum mother code sequence satisfies at least one of:
   sequence number 38 is located in $33^{rd}$ location of the first mother code sequence with a length of 64;
   locations, in the first mother code sequence with the length of 64, of a subsequence of sequence numbers [41, 28, 42] are the $34^{th}$, $35^{th}$, and $36^{th}$ locations;
   sequence number 29 is located in $46^{th}$ location of the first mother code sequence with a length of 64;
   sequence number 43 is located in $47^{th}$ location of the first mother code sequence with a length of 64;
   sequence number 51 is located in $50^{th}$ location of the first mother code sequence with a length of 64;
   sequence number 58 is located in $55^{th}$ location of the first mother code sequence with a length of 64;
   sequence number 62 is located in $62^{nd}$ location of the first mother code sequence with a length of 64;
   sequence number 63 is located in $63^{rd}$ location of the first mother code sequence with a length of 64;
   locations, in the first mother code sequence with the length of 64, of a subset of sequence numbers {30, 45} are {48, 49};
   locations, in the first mother code sequence with the length of 64, of a subset of sequence numbers {46, 53} are {51, 52};
   locations, in the first mother code sequence with the length of 64, of a subset of sequence numbers {54, 57} are {53, 54}; or
   locations, in the first mother code sequence with the length of 64, of a subset of sequence numbers {47, 55, 59, 61} are {58, 59, 60, 61}; or
a sequence number of the first mother code sequence with a length of 32 selected from the maximum mother code sequence satisfies at least one of:
   sequence number 28 is located in $15^{th}$ location of the first mother code sequence with a length of 32;
   sequence number 15 is located in $26^{th}$ location of the first mother code sequence with a length of 32;
   sequence number 23 is located in $27^{th}$ location of the first mother code sequence with a length of 32;
   sequence number 27 is located in $28^{th}$ location of the first mother code sequence with a length of 32;
   sequence number 29 is located in $29^{th}$ location of the first mother code sequence with a length of 32;
   sequence number 30 is located in $30^{th}$ location of the first mother code sequence with a length of 32; or
   sequence number 31 is located in $31^{st}$ location of the first mother code sequence with a length of 32.

6. A communications apparatus, comprising:
at least one processor; and
a non-transitory computer-readable storage medium coupled to the at least one processor and storing programming instructions for execution by the at least one processor, the programming instructions instruct the at least one processor to:
obtain K information bits;
determine a length N of a first mother code sequence of a target polar code based on K, where K<N, $N=2^n$, and n is a positive integer, wherein the first mother code sequence comprises N sequence numbers corresponding to N polarized channels, wherein the N sequence numbers are arranged in an order that reliabilities of their corresponding N polarized channels are in an ascending order, the N sequence numbers are N different integers selected from 0 to N−1;
determine, a set of information bit sequence number corresponding to the K information bits of the target polar code, by selecting K sequence numbers based on reliabilities of corresponding polarized channels from the first mother code sequence, wherein the first mother code sequence is same as a sequence obtained by removing sequence numbers greater than or equal to N from a maximum mother code sequence, and the maximum mother code sequence is pre-stored by the communications apparatus and comprises $N_{max}$ sequence numbers corresponding to $N_{max}$ polarized channels, wherein the $N_{max}$ sequence numbers are $N_{max}$ different integers selected from 0 to $N_{max}-1$ and are arranged in an order that reliabilities of their corresponding $N_{max}$ polarized channels are in an ascending order, and N is less than or equal to $N_{max}$; and perform polar encoding on information bits based on the set of information bit sequence numbers $$x_1^N = u_1^N \cdot F_N$$

wherein $u_1^N=(u_1, u_2, u_3, \ldots u_N)$ is a binary row vector with a length of N, the K information bits are carried in $u_1^N$ according to the set of information bit sequence numbers, $F_N = F_2^{\otimes(\log_2 N)}$, where $$F_2 = \begin{bmatrix} 1 & 0 \\ 1 & 1 \end{bmatrix} \text{ and } F_2^{\otimes(\log_2 N)}$$

is a Kronecker product of $\log_2 N$ $F_2$ matrices.

7. The communication apparatus according to claim 6, wherein the K information bits comprises check bits.

8. The communication apparatus according to claim 6, wherein $N_{max}=1024$.

9. The communication apparatus according to claim 8, wherein sequence number 194 is located in a $137^{th}$ location of the maximum mother code sequence.

10. The communication apparatus according to claim 8, wherein a sequence number of the first mother code sequence with a length of 512 selected from the maximum mother code sequence satisfies at least one of:
sequence number 146 is located in a $94^{th}$ location of the first mother code sequence with a length of 512;
sequence number 468 is located in $427^{th}$ location of the first mother code sequence with a length of 512;
sequence number 505 is located in $502^{nd}$ location of the first mother code sequence with a length of 512;
sequence number 495 is located in $506^{th}$ location of the first mother code sequence with a length of 512;
sequence number 503 is located in $507^{th}$ location of the first mother code sequence with a length of 512;
sequence number 507 is located in $508^{th}$ location of the first mother code sequence with a length of 512;
sequence number 509 is located in $509^{th}$ location of the first mother code sequence with a length of 512;
sequence number 510 is located in $510^{th}$ location of the first mother code sequence with a length of 512;
sequence number 511 is located in $511^{st}$ location of the first mother code sequence with a length of 512; or
locations, in the first mother code sequence with the length of 512, of a subset of sequence numbers {506, 479, 508} are {503, 504, 505};

a sequence number of the first mother code sequence with a length of 256 selected from the maximum mother code sequence satisfies at least one of:
sequence number 100 is located in $87^{th}$ location of the first mother code sequence with a length of 256; or
sequence number 255 is located in $255^{th}$ location of the first mother code sequence with a length of 256;

a sequence number of the first mother code sequence with a length of 128 selected from the maximum mother code sequence satisfies at least one of:
sequence number 93 is located in $109^{th}$ location of the first mother code sequence with a length of 128;
sequence number 127 is located in $127^{th}$ location of the first mother code sequence with a length of 128;
locations, in the first mother code sequence with the length of 128, of a subset of sequence numbers {30, 98, 71, 45, 88} are {65, 66, 67, 68, 69}; or
locations, in the first mother code sequence with the length of 128, of a subset of sequence numbers {123, 125, 126} are {124, 125, 126};

a sequence number of the first mother code sequence with a length of 64 selected from the maximum mother code sequence satisfies at least one of:
sequence number 38 is located in $33^{rd}$ location of the first mother code sequence with a length of 64;
locations, in the first mother code sequence with the length of 64, of a subsequence of sequence numbers [41, 28, 42] are the $34^{th}$, $35^{th}$, and $36^{th}$ locations;
sequence number 29 is located in $46^{th}$ location of the first mother code sequence with a length of 64;
sequence number 43 is located in $47^{th}$ location of the first mother code sequence with a length of 64;
sequence number 51 is located in $50^{th}$ location of the first mother code sequence with a length of 64;
sequence number 58 is located in $55^{th}$ location of the first mother code sequence with a length of 64;
sequence number 62 is located in $62^{nd}$ location of the first mother code sequence with a length of 64;
sequence number 63 is located in $63^{rd}$ location of the first mother code sequence with a length of 64;
locations, in the first mother code sequence with the length of 64, of a subset of sequence numbers {30, 45} are {48, 49};
locations, in the first mother code sequence with the length of 64, of a subset of sequence numbers {46, 53} are {51, 52};
locations, in the first mother code sequence with the length of 64, of a subset of sequence numbers {54, 57} are {53, 54}; or
locations, in the first mother code sequence with the length of 64, of a subset of sequence numbers {47, 55, 59, 61} are {58, 59, 60, 61}; or a sequence number of the first mother code sequence with a length of 32 selected from the maximum mother code sequence satisfies at least one of:
sequence number 28 is located in $15^{th}$ location of the first mother code sequence with a length of 32;
sequence number 15 is located in $26^{th}$ location of the first mother code sequence with a length of 32;
sequence number 23 is located in $27^{th}$ location of the first mother code sequence with a length of 32;
sequence number 27 is located in $28^{th}$ location of the first mother code sequence with a length of 32;
sequence number 29 is located in $29^{th}$ location of the first mother code sequence with a length of 32;
sequence number 30 is located in $30^{th}$ location of the first mother code sequence with a length of 32; or
sequence number 31 is located in $31^{st}$ location of the first mother code sequence with a length of 32.

11. A non-transitory computer-readable storage medium, configured to store programming instructions for execution by a communications apparatus, the programming instructions instruct the communications apparatus to:

obtain K information bits;

determine a length N of a first mother code sequence of a target polar code based on K, where K<N, N=2$^n$, and n is a positive integer, wherein the first mother code sequence comprises N sequence numbers corresponding to N polarized channels, wherein the N sequence numbers are arranged in an order that reliabilities of their corresponding N polarized channels are in an ascending order, the N sequence numbers are N different integers selected from 0 to N−1;

determine, a set of information bit sequence number corresponding to the K information bits of the target polar code, by selecting K sequence numbers based on reliabilities of corresponding polarized channels from the first mother code sequence, wherein the first mother code sequence is same as a sequence obtained by removing sequence numbers greater than or equal to N from a maximum mother code sequence, and the maximum mother code sequence is pre-stored by the communications apparatus and comprises $N_{max}$ sequence numbers corresponding to $N_{max}$ polarized channels, wherein the $N_{max}$ sequence numbers are $N_{max}$ different integers selected from 0 to $N_{max}$−1 and are arranged in an order that reliabilities of their corresponding $N_{max}$ polarized channels are in an ascending order, and N is less than or equal to $N_{max}$; and perform polar encoding on information bits based on the set of information bit sequence numbers $$x_1^N = u_1^N \cdot F_N$$

wherein $u_1^N = (u_1, u_2, u_3, \ldots u_N)$ is a binary row vector with a length of N, the K information bits are carried in $u_1^N$ according to the set of information bit sequence numbers, $F_N = F_2^{\otimes(\log_2 N)}$, where $$F_2 = \begin{bmatrix} 1 & 0 \\ 1 & 1 \end{bmatrix} \text{ and } F_2^{\otimes(\log_2 N)}$$

is a Kronecker product of $\log_2 N$ $F_2$ matrices.

12. The non-transitory computer-readable storage medium according to claim 11, wherein the K information bits comprises check bits.

13. The non-transitory computer-readable storage medium according to claim 11, wherein a length of the maximum mother code sequence is 1024.

14. The non-transitory computer-readable storage medium according to claim 13, wherein sequence number 194 is located in a 137$^{th}$ location of the maximum mother code sequence.

15. The non-transitory computer-readable storage medium according to claim 13, wherein a sequence number of the first mother code sequence with a length of 512 selected from the maximum mother code sequence satisfies at least one of:
sequence number 146 is located in a 94$^{th}$ location of the first mother code sequence with a length of 512;
sequence number 468 is located in 427$^{th}$ location of the first mother code sequence with a length of 512;
sequence number 505 is located in 502$^{nd}$ location of the first mother code sequence with a length of 512;
sequence number 495 is located in 506$^{th}$ location of the first mother code sequence with a length of 512;
sequence number 503 is located in 507$^{th}$ location of the first mother code sequence with a length of 512;
sequence number 507 is located in 508$^{th}$ location of the first mother code sequence with a length of 512;
sequence number 509 is located in 509$^{th}$ location of the first mother code sequence with a length of 512;
sequence number 510 is located in 510$^{th}$ location of the first mother code sequence with a length of 512;
sequence number 511 is located in 511$^{st}$ location of the first mother code sequence with a length of 512; or
locations, in the first mother code sequence with the length of 512, of a subset of sequence numbers {506, 479, 508} are {503, 504, 505};

a sequence number of the first mother code sequence with a length of 256 selected from the maximum mother code sequence satisfies at least one of:
sequence number 100 is located in 87$^{th}$ location of the first mother code sequence with a length of 256; or
sequence number 255 is located in 255$^{th}$ location of the first mother code sequence with a length of 256;

a sequence number of the first mother code sequence with a length of 128 selected from the maximum mother code sequence satisfies at least one of:
sequence number 93 is located in 109$^{th}$ location of the first mother code sequence with a length of 128;
sequence number 127 is located in 127$^{th}$ location of the first mother code sequence with a length of 128;
locations, in the first mother code sequence with the length of 128, of a subset of sequence numbers {30, 98, 71, 45, 88} are {65, 66, 67, 68, 69}; or
locations, in the first mother code sequence with the length of 128, of a subset of sequence numbers {123, 125, 126} are {124, 125, 126};

a sequence number of the first mother code sequence with a length of 64 selected from the maximum mother code sequence satisfies at least one of:
sequence number 38 is located in 33$^{rd}$ location of the first mother code sequence with a length of 64;
locations, in the first mother code sequence with the length of 64, of a subsequence of sequence numbers [41, 28, 42] are the 34$^{th}$, 35$^{th}$, and 36$^{th}$ locations;
sequence number 29 is located in 46$^{th}$ location of the first mother code sequence with a length of 64;
sequence number 43 is located in 47$^{th}$ location of the first mother code sequence with a length of 64;
sequence number 51 is located in 50$^{th}$ location of the first mother code sequence with a length of 64;
sequence number 58 is located in 55$^{th}$ location of the first mother code sequence with a length of 64;
sequence number 62 is located in 62$^{nd}$ location of the first mother code sequence with a length of 64;
sequence number 63 is located in 63$^{rd}$ location of the first mother code sequence with a length of 64;
locations, in the first mother code sequence with the length of 64, of a subset of sequence numbers {30, 45} are {48, 49};
locations, in the first mother code sequence with the length of 64, of a subset of sequence numbers {46, 53} are {51, 52};
locations, in the first mother code sequence with the length of 64, of a subset of sequence numbers {54, 57} are {53, 54}; or
locations, in the first mother code sequence with the length of 64, of a subset of sequence numbers {47, 55, 59, 61} are {58, 59, 60, 61}; or a sequence number of the first mother code sequence with a length of 32 selected from the maximum mother code sequence satisfies at least one of:

sequence number 28 is located in $15^{th}$ location of the first mother code sequence with a length of 32;
sequence number 15 is located in $26^{th}$ location of the first mother code sequence with a length of 32;
sequence number 23 is located in $27^{th}$ location of the first mother code sequence with a length of 32;
sequence number 27 is located in $28^{th}$ location of the first mother code sequence with a length of 32;
sequence number 29 is located in $29^{th}$ location of the first mother code sequence with a length of 32;
sequence number 30 is located in $30^{th}$ location of the first mother code sequence with a length of 32; or
sequence number 31 is located in $31^{st}$ location of the first mother code sequence with a length of 32.

\* \* \* \* \*